(12) United States Patent
Kim

(10) Patent No.: US 10,374,012 B2
(45) Date of Patent: Aug. 6, 2019

(54) ELECTRONIC DEVICE AND METHOD OF FABRICATING THE SAME

(71) Applicant: SK hynix Inc., Icheon (KR)

(72) Inventor: Dong Hoon Kim, Cheongju (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 16/030,619

(22) Filed: Jul. 9, 2018

(65) Prior Publication Data

US 2019/0157349 A1    May 23, 2019

(30) Foreign Application Priority Data

Nov. 17, 2017  (KR) .................. 10-2017-0154225

(51) Int. Cl.
| | |
|---|---|
| H01L 47/00 | (2006.01) |
| H01L 27/24 | (2006.01) |
| H01L 23/528 | (2006.01) |
| H01L 45/00 | (2006.01) |
| H01L 23/522 | (2006.01) |

(52) U.S. Cl.
CPC ........ H01L 27/2481 (2013.01); H01L 23/528 (2013.01); H01L 23/5226 (2013.01); H01L 27/2409 (2013.01); H01L 45/1233 (2013.01); H01L 45/16 (2013.01)

(58) Field of Classification Search
CPC ............ H01L 27/2481; H01L 45/1233; H01L 23/528; H01L 23/5226
See application file for complete search history.

(56) References Cited

U.S. PATENT DOCUMENTS

| | | | |
|---|---|---|---|
| 9,231,202 B2 | 1/2016 | Pangal et al. | |
| 2004/0081004 A1* | 4/2004 | Okazawa | G11C 11/16 365/200 |
| 2016/0276022 A1 | 9/2016 | Redaelli | |
| 2017/0244030 A1* | 8/2017 | Park | H01L 27/2481 |

* cited by examiner

*Primary Examiner* — Didarul A Mazumder
*Assistant Examiner* — Wasiul Haider

(57) ABSTRACT

Provided herein may be an electronic device including a semiconductor memory. The semiconductor memory may include: first column lines and sub-column lines extending in a first direction; first row lines extending in a second direction; first tiles including first memory cells connected between the first column lines and the first row lines; first contact plugs coupled to the sub-column lines and disposed between the first tiles in the first direction; second contact plugs coupled to the first row lines and disposed between the first tiles in the second direction; and a first connection structure partially coupling the first column lines to the sub-column lines such that the longer a current path on a first row line from a selected first memory cell to the corresponding second contact plug, the shorter a current path from the selected first memory cell to the corresponding first contact plug.

20 Claims, 30 Drawing Sheets

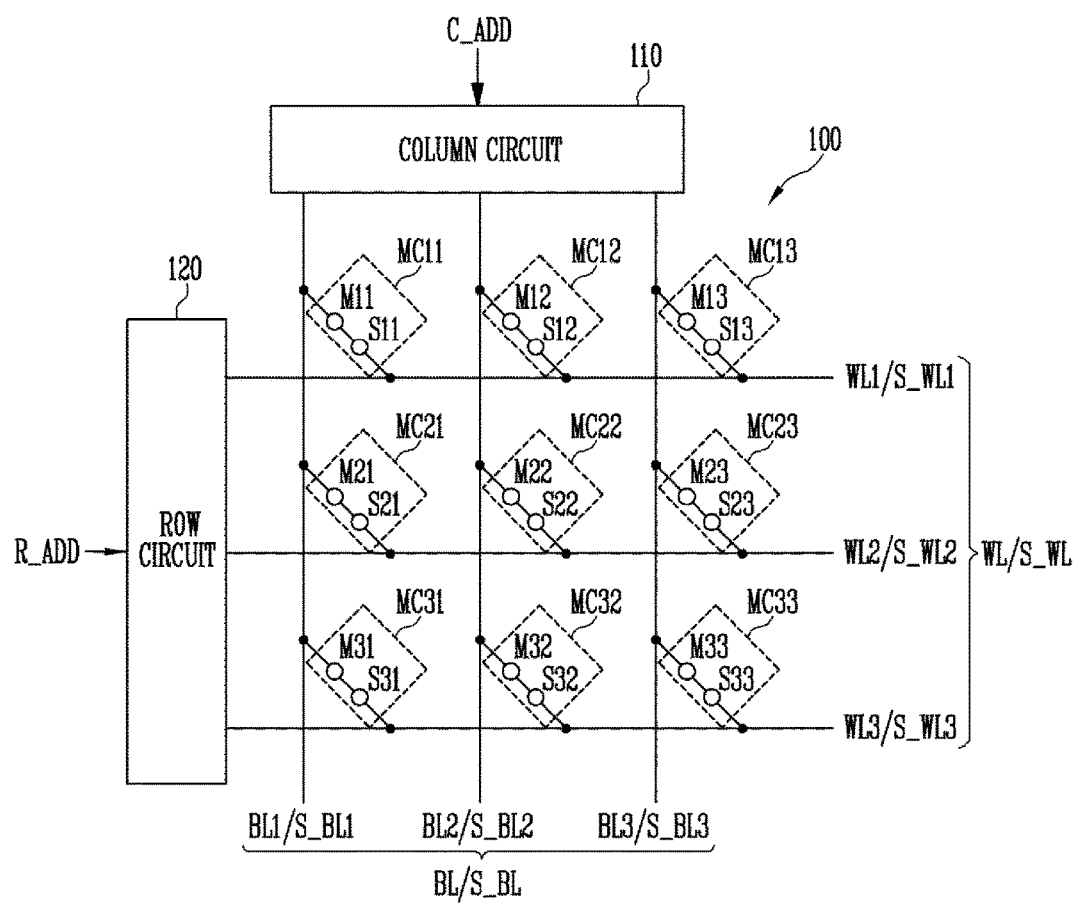

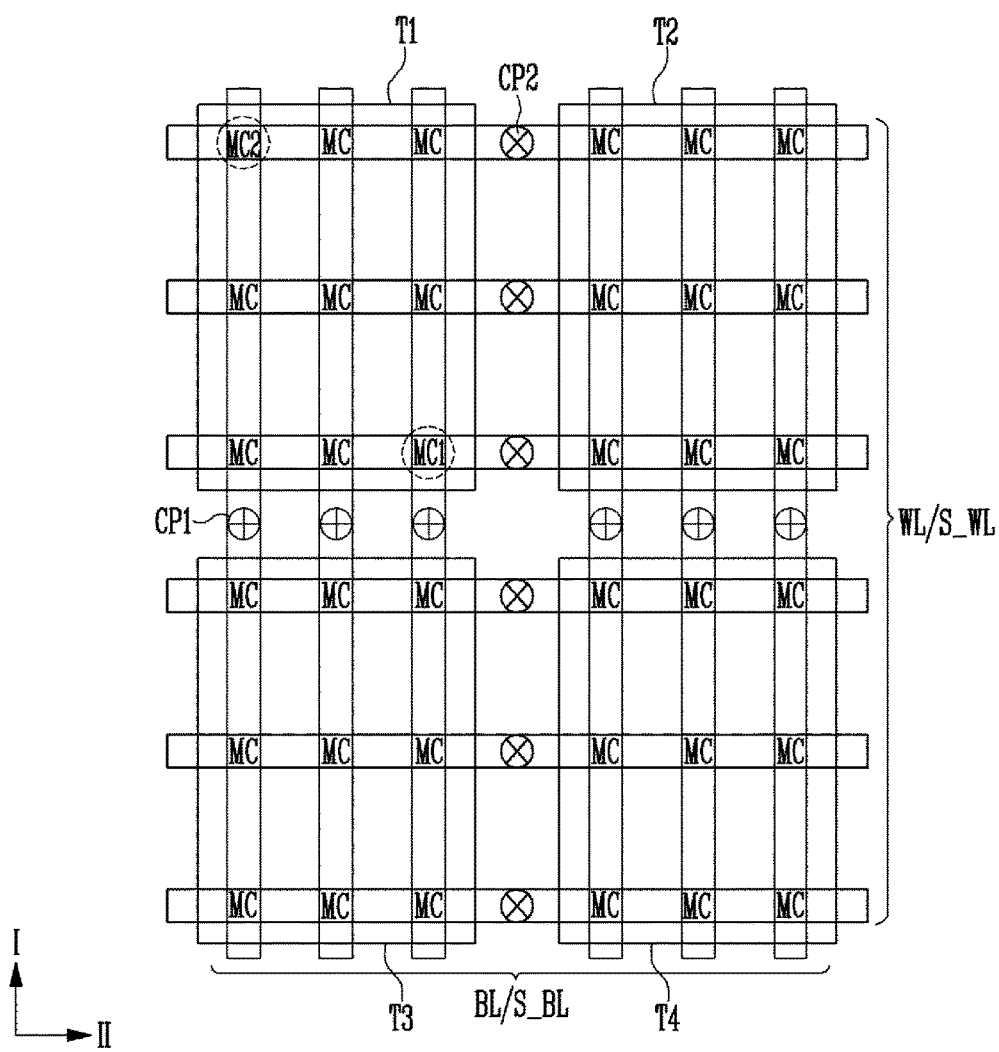

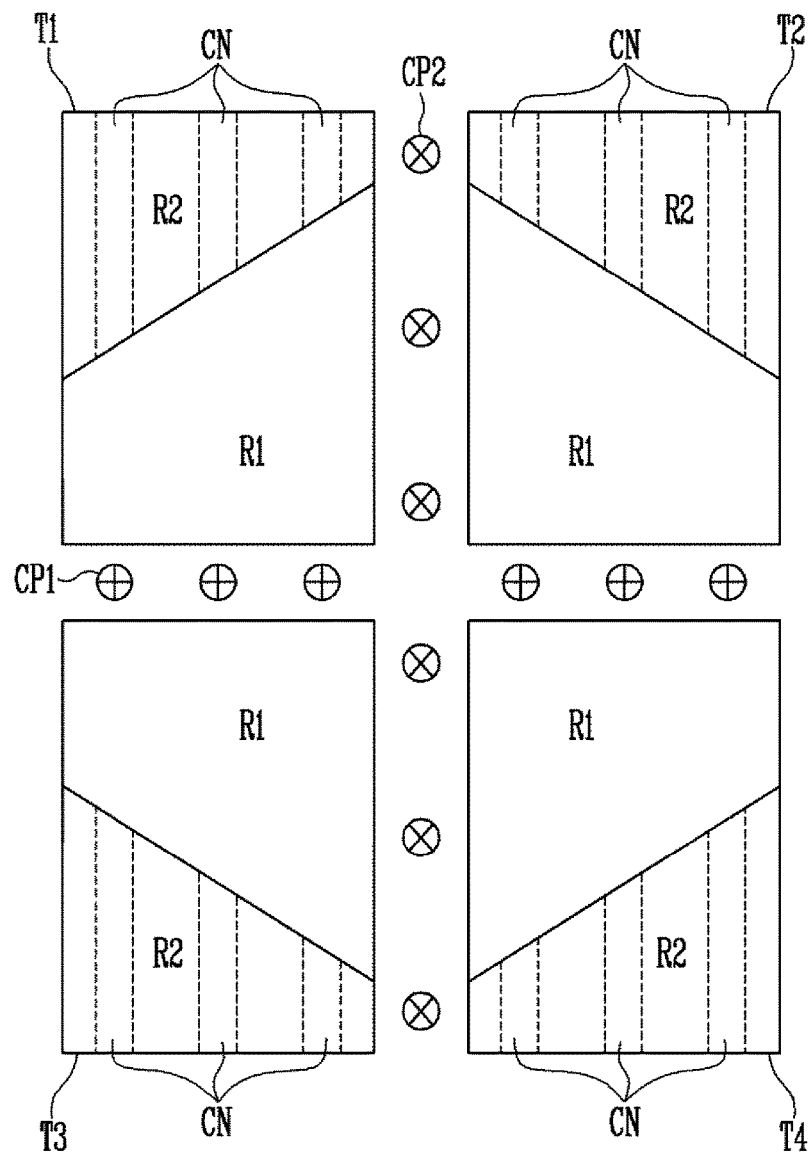

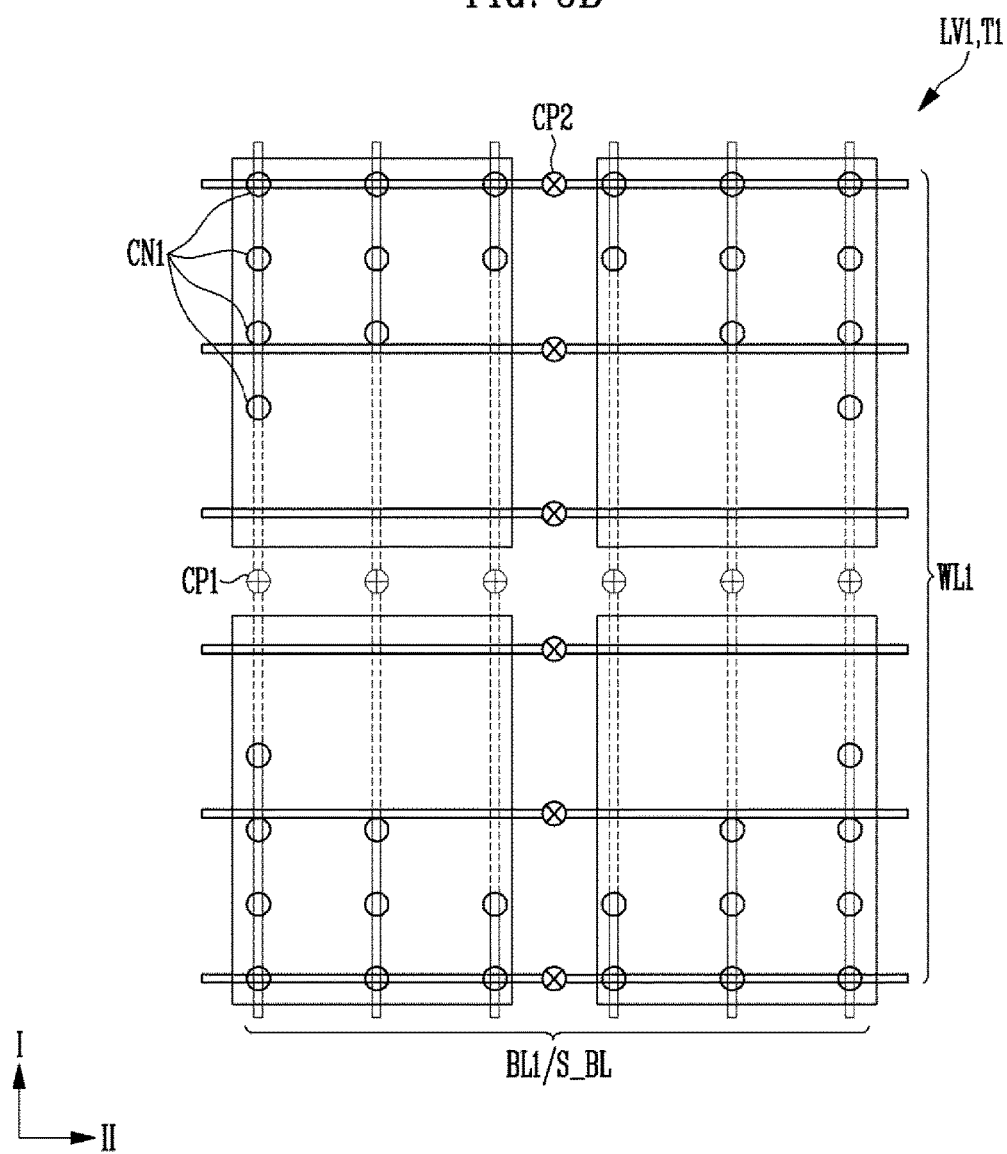

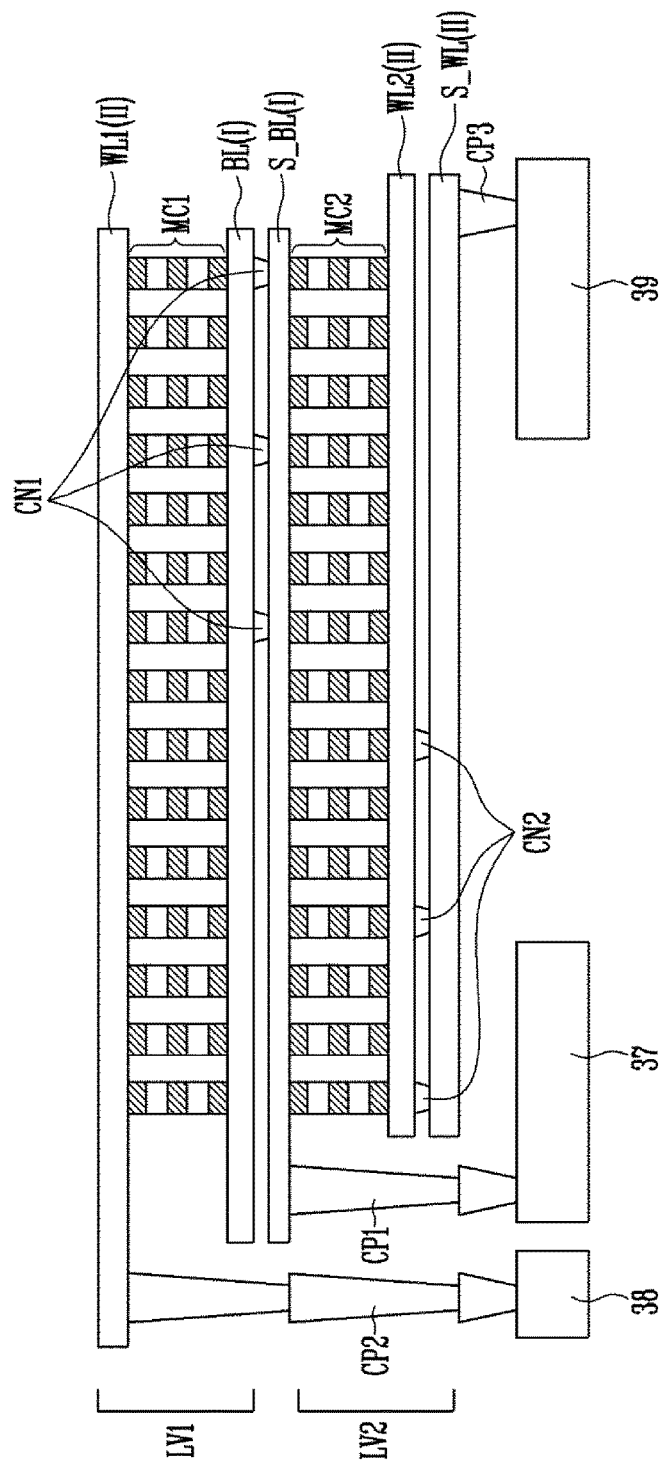

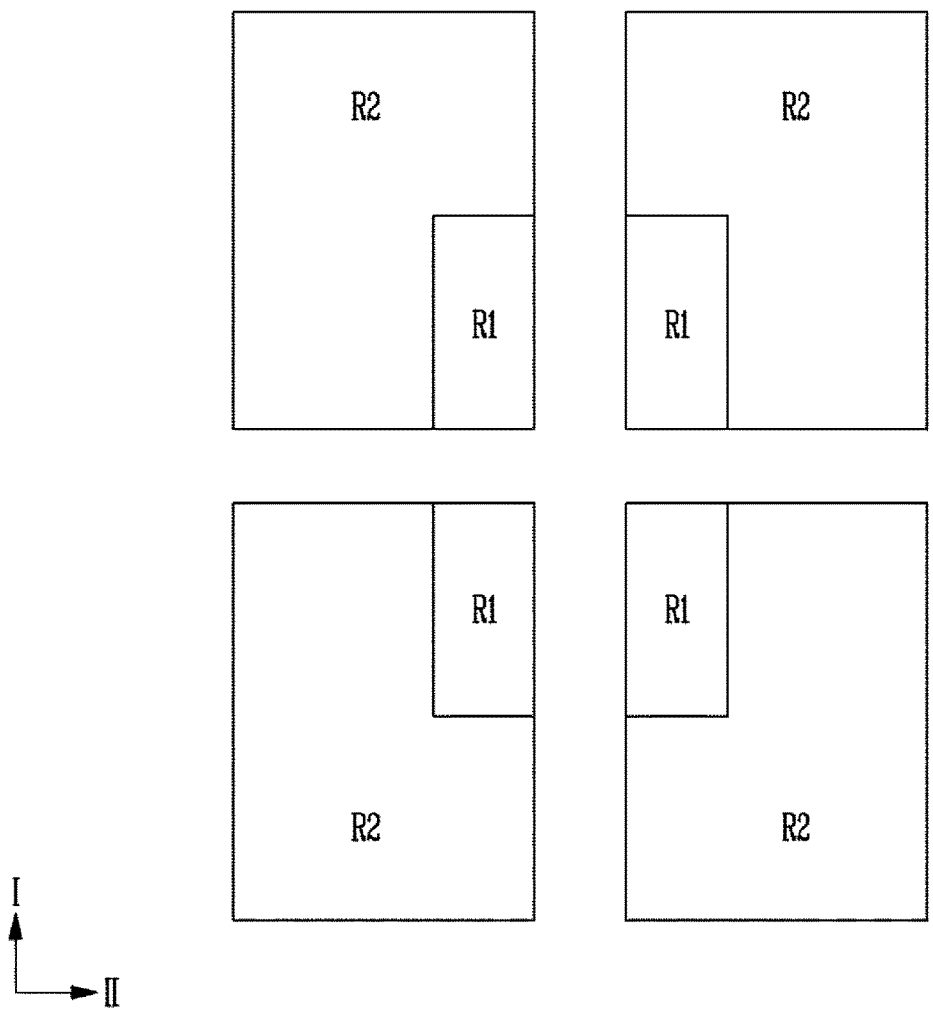

A − A'

ELECTRONIC DEVICE AND METHOD OF FABRICATING THE SAME

CROSS-REFERENCE TO RELATED APPLICATION

The present application claims priority under 35 U.S.C. § 119(a) to Korean patent application number 10-2017-0154225 filed on Nov. 17, 2017 in the Korean Intellectual Property Office, the entire disclosure of which is incorporated herein by reference.

BACKGROUND

1. Technical Field

Various embodiments of the present disclosure relate to a memory circuit or device, and application thereof in an electronic device.

2. Related Art

Recently, with requirements of miniaturization, low power consumption, high performance, and diversification of electronic devices, semiconductor devices configured to store information are needed in various electronic devices such as computers and portable communication apparatuses. Therefore, there has been research on semiconductor devices configured to store data using characteristics of switching between different resistance phases depending on applied voltage or current. Examples of such semiconductor devices include a resistive random access memory (RRAM), a phase-change random access memory (PRAM), a ferroelectric random access memory (FRAM), a magnetic random access memory (MRAM), an E-fuse, and so forth.

SUMMARY

Various embodiments of the present disclosure are directed to an electronic device provided with memory cells having improved operating characteristics and reliability, and a method of fabricating the electronic device.

An embodiment of the present disclosure may provide for an electronic device comprising a semiconductor memory, wherein the semiconductor memory may include: first column lines extending in a first direction; sub-column lines extending in the first direction; first row lines extending in a second direction intersecting with the first direction; first tiles including first memory cells connected between the first column lines and the first row lines; first contact plugs disposed between the first tiles that are adjacent to each other in the first direction, the first contact plugs being coupled to the sub-column lines; second contact plugs disposed between the first tiles that are adjacent to each other in the second direction, the second contact plugs being coupled to the first row lines; and a first connection structure coupled between the first column lines and the sub-column lines at predetermined locations such that, as a length of a current path on a first row line from a selected first memory cell to a corresponding second contact plug increases, a length of a current path from the selected first memory cell to a corresponding first contact plug decreases.

An embodiment of the present disclosure may provide for an electronic device comprising a semiconductor memory, wherein the semiconductor memory may include: a first deck including first memory cells; a second deck disposed over the first deck, and including second memory cells; a first column line electrically coupled to the first memory cells; a second column line electrically coupled to the second memory cells; a sub-column line disposed between the first deck and the second deck and coupled to a column circuit that drives the first column line and the second column line; a first connection structure coupled between the first column line and the sub-column line; and a second connection structure coupled between the second column line and the sub-column line.

BRIEF DESCRIPTION OF THE DRAWINGS

FIGS. 1A and 1B are circuit diagrams illustrating a memory cell array to show the structure of an electronic device in accordance with an embodiment of the present disclosure.

FIGS. 3A to 3C are diagrams illustrating the structure of an electronic device in accordance with an embodiment of the present disclosure.

FIGS. 4A to 4C are diagrams illustrating the structure of an electronic device in accordance with an embodiment of the present disclosure, in which FIG. 4A is a sectional view of a cell array, FIG. 4B is a diagram illustrating a layout of the cell array, and FIG. 4C is a conceptual view illustrating current paths.

FIGS. 5A to 5E are diagrams illustrating the structure of an electronic device in accordance with an embodiment of the present disclosure, in which FIG. 5A is a sectional view of a cell array, FIGS. 5B and 5D are diagrams illustrating a layout of the cell array, and FIGS. 5C and 5E are conceptual views illustrating current paths.

FIGS. 6A to 6C are diagrams illustrating the structure of an electronic device in accordance with an embodiment of the present disclosure, in which FIG. 6A is a sectional view of a cell array, and FIGS. 6B and 6C are conceptual views illustrating current paths.

FIGS. 7A and 7B are diagrams illustrating the structure of an electronic device in accordance with an embodiment of the present disclosure, in which FIG. 7A is a sectional view of a cell array, and FIG. 7B is a conceptual view illustrating current paths.

FIGS. 8A and 8B are diagrams illustrating modifications of the shapes of first and second regions illustrated in FIG. 3A.

DETAILED DESCRIPTION

Figure 1B:
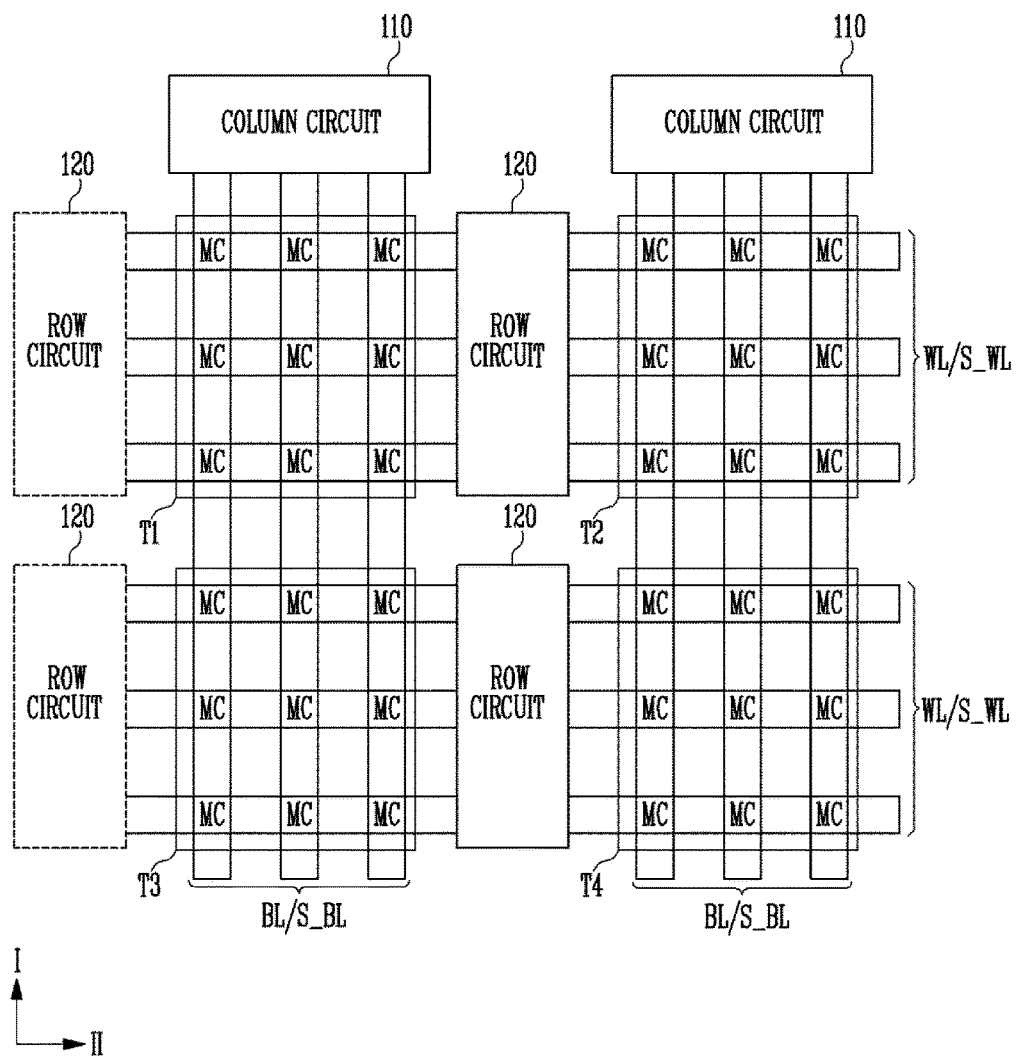

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIGS. 1A and 1B are circuit diagrams illustrating a memory cell array 100 to show the structure of an electronic device in accordance with an embodiment of the present disclosure.

Referring to FIG. 1A, the electronic device in accordance with an embodiment of the present disclosure may include a semiconductor memory. The semiconductor memory may include row lines, and column lines intersecting with the row lines. Here, the row lines may be word lines, and the column lines may be bit lines. For reference, the notions of the terms "word lines" and "bit lines" may be relative to each other. Hence, the row lines may be bit lines, and the column lines may be word lines. The following description will be made on the assumption that row lines WL1 to WL3 are word lines, and column lines BL1 to BL3 are bit lines.

The semiconductor memory may include memory cells MC11 to MC33 respectively disposed between the column lines BL1 to BL3 and the row lines WL1 to WL3. Here, the memory cells MC11 to MC33 may be disposed at respective intersections of the column lines BL1 to BL3 and the row lines WL1 to WL3. Each of the memory cells MC11 to MC33 includes a select element S11 to S33 and a memory element M11 to M33 that are coupled in series to each other. Each of the select elements S11 to S33 may be electrically coupled to a corresponding one of the row lines WL1 to WL3. Each of the memory elements M11 to M33 may be electrically coupled to a corresponding one of the column lines BL1 to BL3.

Each of the memory elements M11 to M33 may be configured to store data, and include variable resistance material. Each of the memory elements M11 to M33 may be a resistance change layer, a phase change layer, a magnetic tunnel junction layer, or the like. Each of the select elements S11 to S33 may be configured to select the corresponding memory cell MC, and include switching material. Each of the select elements S11 to S33 may be a metal insulator transition (MIT) element, a mixed ionic-electronic conducting (MIEC) element, an Ovonic threshold switching (OTS) element, or the like. The shape and the configuration of each of the memory cells MC11 to MC33 may be changed in various ways. For example, the select elements S11 to S33 may be omitted, or the positions of the select elements S11 to S33 and the memory elements M11 to M33 may be switched with each other.

The semiconductor memory may further include a column circuit 110 configured to control the column lines BL1 to BL3, and a row circuit 120 configured to control the row lines WL1 to WL3.

The row circuit 120 may be a row decoder, a word line decoder, a word line driver, or the like. The row circuit 120 may select a row line WL2 among the row lines WL1 to WL3 by a row address R_ADD. The column circuit 110 may be a column decoder, a bit line decoder, a bit line driver, or the like. The column circuit 110 may select a column line BL2 among the column lines BL1 to BL3 by a column address C_ADD. In this case, the memory cell MC22 coupled between the selected column line BL2 and the selected row line WL2 may be selected.

FIG. 1A illustrates an embodiment where the three column lines BL1 to BL3 and the three row lines WL1 to WL3 are provided, but this is only for the sake of description. The present disclosure is not limited to this. The number of column lines BL1 to BL3 or row lines WL1 to WL3 included in the cell array 100 may be changed as needed.

Referring to FIG. 1B, the semiconductor memory may include a plurality of tiles T1 to T4 arranged in a first direction I and a second direction II intersecting with the first direction I. Each of the tiles T1 to T4 may include a cell array having a cross-point structure. Here, each of the tiles T1 to T4 may include a plurality of memory cells MC. In driving the semiconductor memory, memory cells MC having predetermined resistance values within a controllable range may be grouped into a single tile T1, T2, T3 or T4. Therefore, each of the tiles T1 to T4 may be referred to as a single unit that includes a plurality of memory cells MC disposed at respective intersections of column lines BL sharing a corresponding column circuit 110 and row lines WL sharing a corresponding row circuit 120. The semiconductor memory may perform an addressing operation on a per-tile (T1 to T4) basis.

The row circuits 120 and the column circuits 110 may be disposed between the adjacent tiles T1 to T4. For example, each column circuit 110 may be disposed between tiles T1 to T4 that are adjacent to each other in the first direction I. Each row circuit 120 may be disposed between tiles T1 to T4 that are adjacent to each other in the second direction II. Although FIG. 1B illustrates an embodiment where the row circuits 120 are disposed between the first tile T1 and the second tile T2 and between the third tile T3 and the fourth tile T4, the row circuits 120 may be disposed outside the titles T1 to T4, as illustrated by the broken lines.

The row circuits 120 and the column circuits 110 may be disposed on a level different from that of the tiles T1 to T4. For example, the row circuits 120 and the column circuits 110 may be disposed under the tiles T1 to T4 and electrically coupled to the tiles T1 to T4 by a line structure such as a contact plug.

In accordance with the above-mentioned structure, a memory cell MC may be selected using the column circuits 110 and the row circuits 120. Here, the length of an overall current path including a current path from the corresponding row circuit 120 to the memory cell MC and a current path from the memory cell MC to the corresponding column circuit 110 may change depending on the position of the memory cell MC. In other words, depending on the position of each memory cell MC, there may be a memory cell MC the current path of which is relatively long, and also a memory cell MC the current path of which is relatively short. For instance, even though memory cells MC are included in the same tile T, the current paths of the memory cells MC have different lengths depending on relative positions thereof in the tile T, which causes a difference in resistance between the memory cells MC. In this case, overcurrent is applied to a memory cell MC having a short current path, which may cause a problem of deterioration in characteristics of the memory cell MC.

Therefore, in an embodiment of the present disclosure, the column lines BL may be coupled to the column circuit 110 via sub-column lines S_BL, rather than being directly coupled to the column circuit 110. For example, the semiconductor memory may include the sub-column lines S_BL corresponding to the respective column lines BL. The row lines WL may also be coupled to the row circuit 120 via sub-row lines S_WL, rather than being directly coupled to the row circuit 120. For example, the semiconductor memory may include the sub-row lines S_WL corresponding to the respective row lines WL. In this case, the lengths of the current paths of the memory cells MC may be equal to each other by adjusting paths on the sub-column lines S_BL or the sub-row lines S_WL. For reference, the semiconductor memory may include only either the sub-column lines S_BL or the sub-row lines S_WL, or both.

Figure 2A:
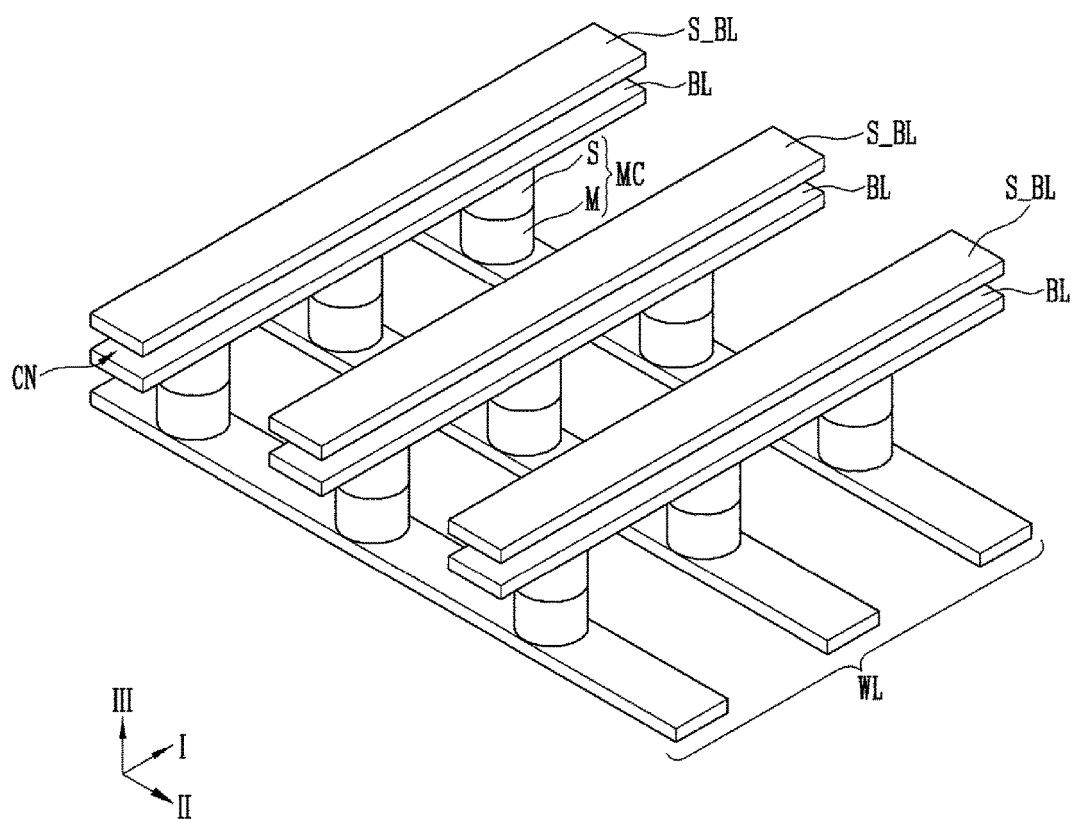
FIGS. 2A and 2B are perspective views illustrating a memory cell array to show the structure of an electronic device in accordance with an embodiment of the present disclosure.
Figure 2B:
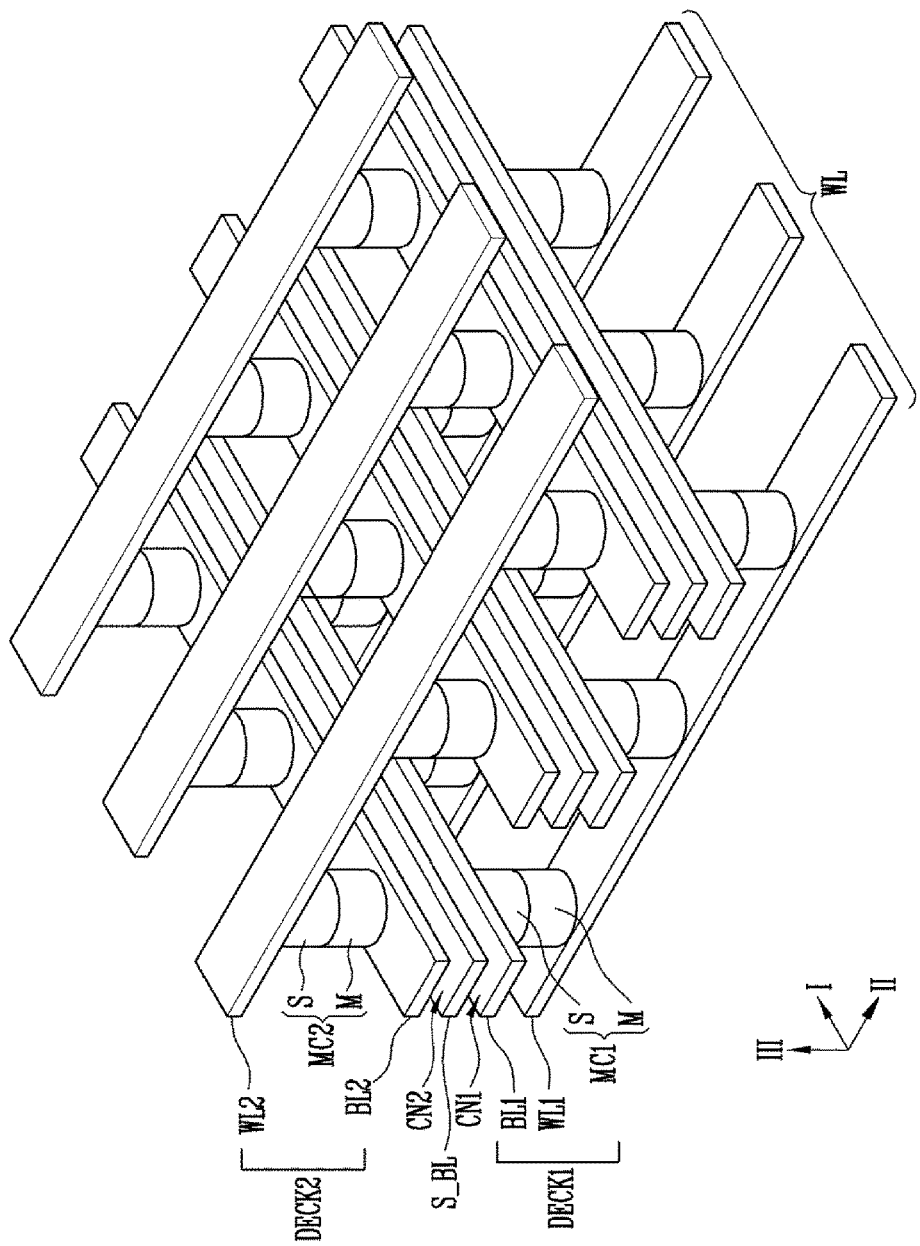

FIGS. 2A and 2B are perspective views illustrating a memory cell array that shows the structure of an electronic device in accordance with an embodiment of the present disclosure.

Referring to FIG. 2A, the memory cell array may include column lines BL, sub-column lines S_BL, and row lines WL. The memory cell array may also include memory cells MC disposed at respective intersections of the column lines BL and the row lines WL. Each of the memory cells MC may include a select element S and a memory element M.

The sub-column lines S_BL may be disposed to correspond to the respective column lines BL. For example, the sub-column lines S_BL may be disposed over the column lines BL, and each pair of sub-column line S_BL and column line BL may have a shape in which the sub-column line S_BL and the column line BL overlap each other in a third direction III. The sub-column lines S_BL and the column lines BL may extend in the first direction I. Likewise, although not shown, sub-row lines may be disposed to correspond to the respective row lines WL. In this case, the sub-row lines may be disposed under the row lines WL, and each pair of sub-row line and row line WL may have a shape in which the sub-row line and the row line WL overlap each other in the third direction III. The sub-row lines and the row lines WL may extend in the second direction II intersecting with the first direction I.

Although not shown, space between adjacent memory cells MC, space between adjacent row lines WL, space between adjacent column lines BL, space between sub-column lines S_BL, and space between each column line BL and the corresponding sub-column line S_BL may be filled with insulating material. A connection structure CN may be provided at predetermined locations between each column line BL and the corresponding sub-column line S_BL and couple the column line BL with the sub-column line S_BL through the insulating material.

Referring to FIG. 2B, the memory cell array may include first column lines BL1, sub-column lines S_BL, second column lines BL2, first row lines WL1, and second row lines WL2. The memory cell array may include first memory cells MC1 disposed at respective intersections of the first column lines BL1 and the first row lines WL1, and second memory cells MC2 disposed at respective intersections of the second column lines BL2 and the second row lines WL2. Each of the memory cells MC1 and MC2 may include a select element S and a memory element M.

The sub-column lines S_BL may be disposed to correspond to the respective first and second column lines BL1 and BL2. For example, the sub-column lines S_BL may be disposed between the first column lines BL1 and the second column lines BL2, and each set of first column line BL1, sub-column line S_BL, and second column line BL2 may have a shape in which the first column line BL1, the sub-column line S_BL, and the second column line BL2 overlap each other in the third direction III. The first column lines BL1, the sub-column lines S_BL, and the second column lines BL2 may extend in the first direction I.

Although FIG. 2B illustrates an embodiment where the memory cell array includes both the first column lines BL1 and the second column lines BL2, either may be omitted. For example, the second column lines BL2 may be omitted, and the sub-column lines S_BL may be used as the second column lines BL2. In this case, the second memory cells MC2 may be disposed at respective intersections of the sub-column lines S_BL and the second row lines WL2. Alternatively, the first column lines BL1 may be omitted, and the sub-column lines S_BL may be used as the first column lines BL1. In this case, the first memory cells MC1 may be disposed at respective intersections of the sub-column lines S_BL and the first row lines WL1.

Space between each first column line BL1, the corresponding sub-column line S_BL, and he corresponding second column line BL2 may be filled with insulating material. A first connection structure CN1 may be provided between each first column line BL1 and the corresponding sub-column line S_BL at a predetermined location and couple the first column line BL1 with the sub-column line S_BL through the insulating material. Likewise, a second connection structure CN2 may be provided between each second column line BL2 and the corresponding sub-column line S_BL at a predetermined location and couple the second column line BL2 with the sub-column line S_BL.

In the foregoing structure, a second deck DECK2 including the second memory cells MC2 is disposed over a first deck DECK1 including the first memory cells MC1. Furthermore, an additional deck may be stacked on the second deck DECK2. Accordingly, embodiments of the present disclosure may include a multi-level structure comprising a plurality of stacked cell layers.

Figure 3A:
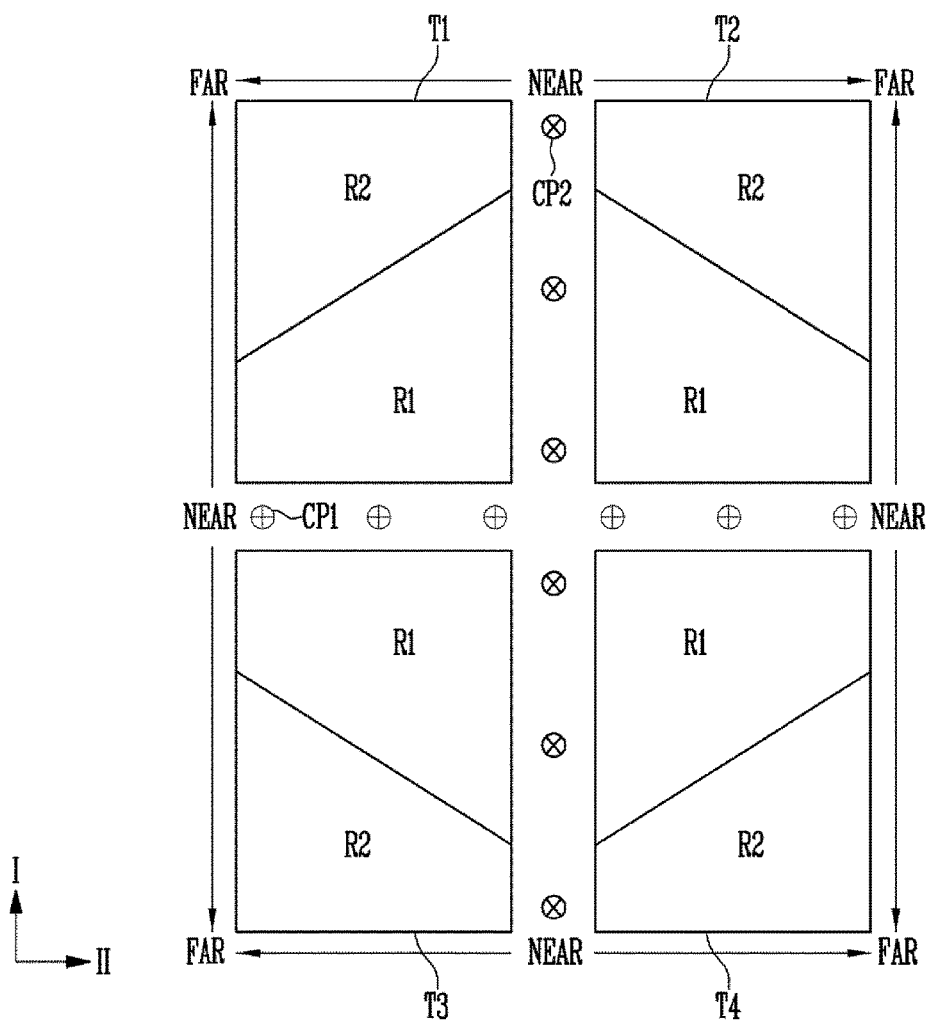

FIGS. 3A to 3C are diagrams illustrating the structure of an electronic device in accordance with an embodiment of the present disclosure.

Referring to FIGS. 3A and 3B, the semiconductor memory may include a plurality of tiles T1 to T4 arranged in the first direction I and the second direction II intersecting with the first direction I. First contact plugs CP1 and second plugs CP2 may be disposed between the adjacent tiles T1 to T4. For example, the first contact plugs CP1 may be disposed between the first tile T1 and the third tile T3 that are adjacent to each other in the first direction I, or between the second tile T2 and the fourth tile T4 that are adjacent to each other in the first direction I. The second contact plugs CP2 may be disposed between the first tile T1 and the second tile T2 that are adjacent to each other in the second direction II, or between the third tile T3 and the fourth tile T4 that are adjacent to each other in the second direction II.

The first contact plugs CP1 may be electrically coupled to a column circuit, and directly couple the sub-column lines S_BL with the column circuit. The second contact plugs CP2 may be electrically coupled to a row circuit, and directly couple the row lines WL with the row circuit. Alternatively, the sub-row lines S_WL may be directly coupled to the row circuit by the second contact plugs CP2.

Figure 8A:
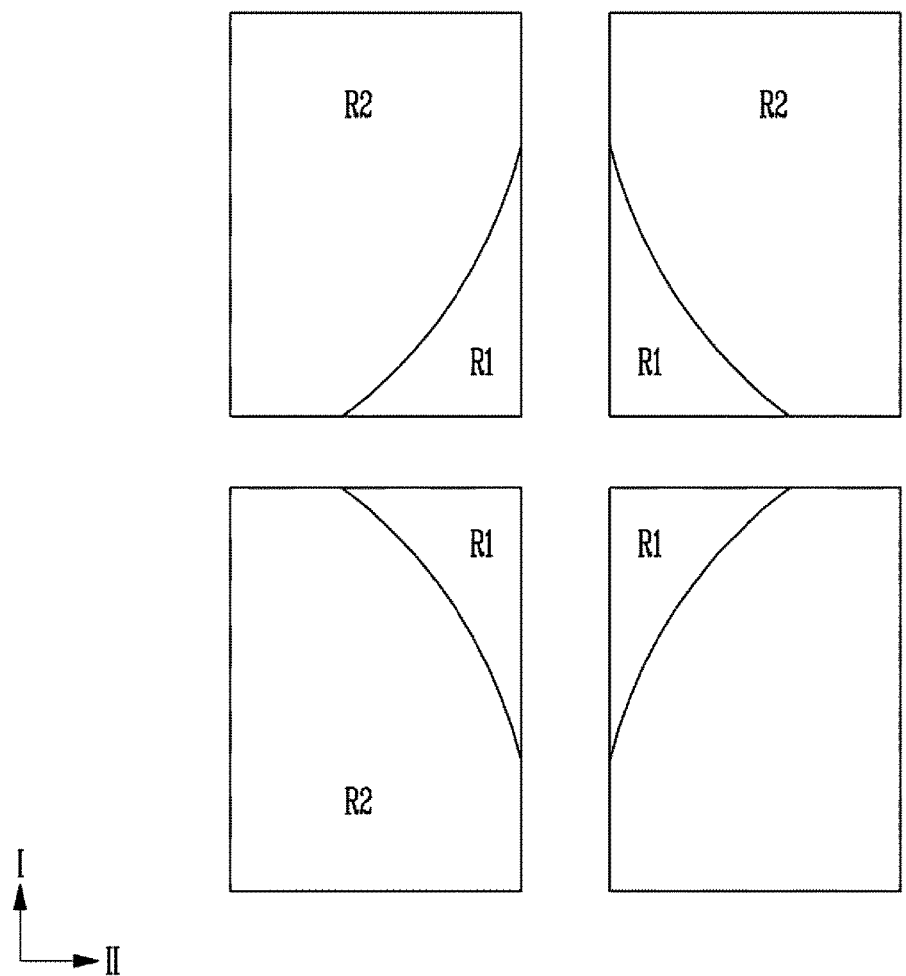

Each of the tiles T1 to T4 may include a region formed relatively near to the first and second contact plugs CP1 and CP2, and a region formed relatively far therefrom. Taking an overall current path of each of the memory cells into account, the regions may be defined as a first region R1 the overall current path of which is relatively short, and a second region R2 the overall current path of which is relatively long. Here, the first region R1 may be defined based on each of the tiles T1 to T4, or alternatively defined based on the plurality of tiles T1 to T4. For example, four tiles T1 to T4 that are adjacent to each other in the first direction I and the second direction II may form a single set. The adjacent first regions R1 of a set of four tiles may form a particular shape such as a rectangle, a circle, an elliptical shape, etc. A boundary between the first region R1 and the second region R2 may be linear or curved. The arrangement of the first region R1 and the second region R2 may be modified in various ways, and some embodiments thereof are illustrated in FIGS. 8A and 8B. Referring to FIG. 8A, the first regions R1 of a set of tiles are arranged in a rhombus shape, and the boundaries between the first region R1 and the second region R2 are curved. Referring to FIG. 8B, in another embodiment, the first region R1 of four adjacent tiles in a set may be defined in a rectangular shape.

Referring to FIG. 3C, connection structures CN may only be disposed in the second region R2. The connection structures CN may be disposed in regions overlapping with the sub-column lines S_BL and the column lines BL. In FIG. 3C, regions in which the connection structures CN may be disposed are indicated by the broken lines. The connection structures CN may include conductive patterns having island shapes spaced apart from each other by a predetermined distance, or conductive patterns having line shapes corresponding to the column lines BL and the sub-column lines S_BL. Space between the conductive patterns may be filled with insulating material, e.g., a nitride layer.

Therefore, in the first region R1, the sub-column lines S_BL and the column lines BL may not be directly coupled to each other, and a current path detouring to the second region R2 in which the connection structures CN are disposed may be formed. Thus, the length of the current path of a first memory cell MC1 disposed in the first region R1 of FIG. 3B is increased. On the other hand, in the second region R2, the sub-column lines S_BL are directly coupled to the column lines BL by the connection structures CN, so that the length of the current path of a second memory cell MC2 disposed in the second region R2 is not increased. Thereby, a length difference in current path between the first memory cell MC1 and the second memory cell MC2 is reduced.

Although the figures illustrate an embodiment where the connection structures CN overlaps with the sub-column lines S_BL, in another embodiment the connection structures CN may overlap with a sub-row line S_WL. In the case where the memory cell array includes the sub-row line S_WL, the connection structures CN may be disposed in regions overlapping with the sub-row lines S_WL and the row lines WL in the second region R2.

In such a structure, each column line BL and the corresponding sub-column line S_BL are electrically coupled to each other by the corresponding connection structure CN. A current path passing through the column line BL and the sub-column line S_BL is formed via the connection structure CN. Therefore, the length of the current path may be relatively increased or reduced by controlling the position of the connection structure CN.

Figure 4A:
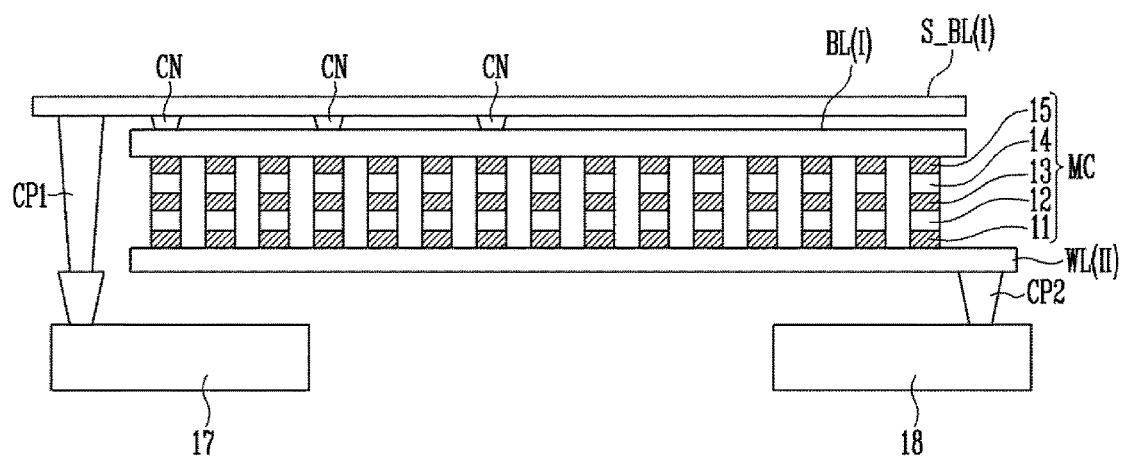
Figure 4B:
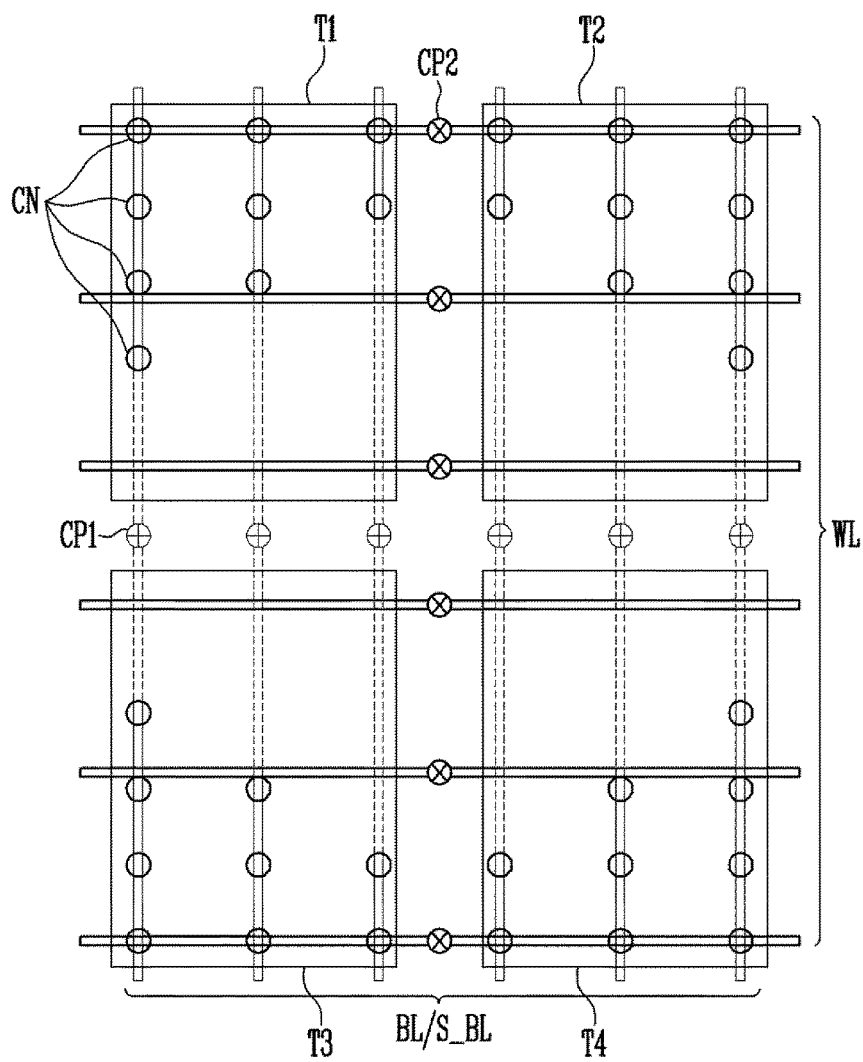
Figure 4C:
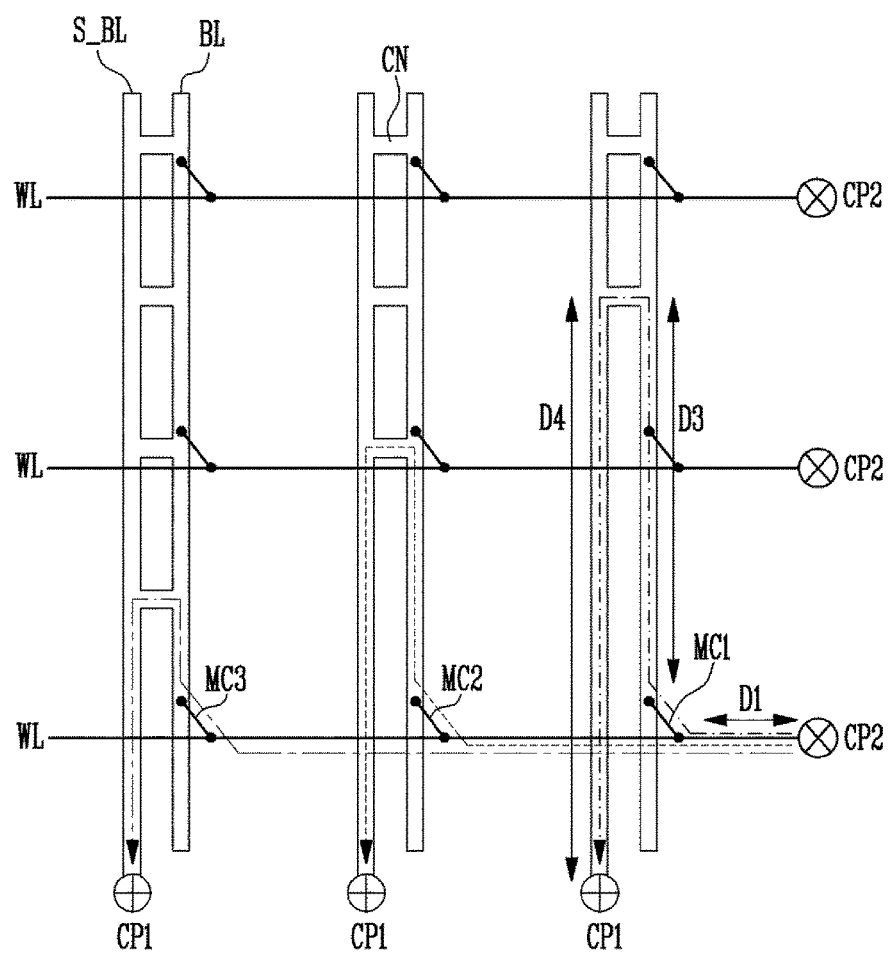

FIGS. 4A to 4C are diagrams illustrating the structure of an electronic device in accordance with an embodiment of the present disclosure, in which FIG. 4A is a sectional view of a cell array, FIG. 4B is a diagram illustrating a layout of the cell array, and FIG. 4C is a conceptual view illustrating current paths.

Referring to FIG. 4A, the electronic device in accordance with an embodiment of the present disclosure may include a semiconductor memory. The semiconductor memory may include column lines BL, row lines WL, memory cells MC, sub-column lines S_BL, first contact plugs CP1, second contact plugs CP2, and connection structures CN. Here, each column line BL may be a bit line, each sub-column line S_BL may be a sub-bit line, and each row line WL may be a word line.

The column lines BL and the row lines WL may be disposed on different levels. The column lines BL may be disposed over the row lines WL. The column liens BL may extend in the first direction I, and the row lines WL may extend in the second direction II intersecting with the first direction I. In this drawing, for the sake of description, the column lines BL and the sub-column lines S_BL are illustrated in a sectional view corresponding to the first direction I, and the row lines WL are illustrated in a sectional view corresponding to the second direction II. In other words, FIG. 4A combines views from two orthogonal planes of a tile into a single plane for ease of illustration.

The memory cells MC are disposed at respective intersections of the column lines BL and the row lines WL. Each of the memory cells MC may include a lower electrode 11, a switching material layer 12, an intermediate electrode 13, a variable resistance material layer 14, and an upper electrode 15 which are successively stacked. The lower electrode 11 may be electrically coupled to the row line WL. The upper electrode 15 may be electrically coupled to the column line BL.

The sub-column lines S_BL may be disposed over the column lines BL and extend in the first direction I. For example, the row lines WL, the column lines BL, and the sub-column lines S_BL may be successively stacked. The sub-column lines S_BL may be coupled to the column lines BL by the connection structures CN disposed at predetermined locations.

The first contact plugs CP1 may be electrically coupled to the sub-column lines S_BL. The sub-column lines S_BL may be coupled to a column circuit by the first contact plugs CP1. Here, reference numeral "17" may denote the column circuit, or a line structure coupled with the column circuit.

Each of the first contact plugs CP1 may be coupled to a first end of the corresponding sub-column line S_BL. Therefore, memory cells MC coupled to the first ends of the sub-column lines S_BL are disposed relatively near to the first contact plugs CP1, and memory cells MC coupled to second ends of the sub-column lines S_BL are disposed relatively far from the first contact plugs CP1. Likewise, because the column lines BL are disposed at positions corresponding to the respective sub-column lines S_BL, memory cells MC coupled to first ends of the column lines BL are disposed relatively near to the first contact plugs CP1, and memory cells MC coupled to second ends of the column lines BL are disposed relatively far from the first contact plugs CP1.

The second contact plugs CP2 may be electrically coupled to the row lines WL. The row lines WL are coupled to a row circuit by the second contact plugs CP2. Here, reference numeral "18" may denote the row circuit, or a line structure coupled with the row circuit.

Each of the second contact plugs CP2 may be coupled to a first end of the corresponding row line WL. Therefore, memory cells MC coupled to the first ends of the row lines WL are disposed relatively near to the second contact plugs CP2. Memory cells MC coupled to second ends of the row lines WL are disposed relatively far from the second contact plugs CP2.

Referring to FIG. 4B, the connection structures CN may be disposed in regions overlapping with the sub-column lines S_BL and the column lines BL in the second region R2. FIG. 4B illustrates an embodiment where the connection structures CN are island shaped conductive patterns spaced apart from each other by a predetermined distance.

The connection structures CN included in the adjacent tiles T1 to T4 may form a mirrored, or symmetric structure. For example, in the case of the first tile T1 and the third tile T3 that are adjacent to each other in the first direction I, the connection structures CN of the first tile T1 and the connection structures CN of the third tile T3 may form a symmetric structure based on an axis of symmetry extending in the second direction II. Likewise, in the case of the first tile T1 and the second tile T2 that are adjacent to each other in the second direction II, the connection structures CN of the first tile T1 and the connection structures CN of the second tile T2 may form a symmetric structure based on an axis of symmetry extending in the first direction I.

In FIG. 4B, for better understanding, the column lines BL and the sub-column lines S_BL in a region corresponding to the first region R1 are indicated by the broken lines. The first region R1 indicated by the broken lines is a region in which there is no connection structure CN so that the sub-column lines S_BL and the column lines BL are not directly coupled to each other.

FIG. 4C illustrates current paths determined depending on relative positions of the memory cells included in the first tile T1. Here, each current path is formed by a combination of a first path D1 from a selected memory cell to the corresponding second contact plug CP2 and a second path from the selected memory cell to the corresponding first contact plug CP1. The second path is formed by a combination of a third path D3 on the column line BL and a fourth path D4 on the sub-column line S_BL. Therefore, the current path may be controlled such that the longer the first path D1, the shorter the second path D3+D4. Thereby, the memory cells may have current paths having a uniform length, and have similar resistance values.

For instance, among the memory cells MC1 to MC3 sharing the same row line WL, the first memory cell MC1 is disposed closer to the corresponding second contact plug CP2 than is the second or third memory cell MC2 or MC3. Hence, the first memory cell MC1 has a relatively short first path D1. In this case, to increase the length of the second path D3+D4, the connection structure CN for the corresponding column line BL and the corresponding sub-column line S_BL is disposed relatively far from the first connect plug CP1. Thereby, the length of the second path D3+D4 from the first memory cell MC1 to the first contact plug CP1 is increased, so that the overall length of the current path of the first memory cell MC1 becomes similar to that of the current path of the second or third memory cell MC2 or MC3.

Furthermore, among the memory cells MC1 to MC3 sharing the same row line WL, the third memory cell MC3 is disposed farther from the corresponding second contact plug CP2 than is the first or second memory cell MC1 or MC2. Hence, the third memory cell MC3 has a relatively long first path D1 compared to that of the first or second memory cell MC1 or MC2. In this case, to reduce the length of the second path D3+D4, the connection structure CN for the corresponding column line BL and the corresponding sub-column line S_BL is disposed closer to the first contact plug CP1 than the connection structure CN for first or second memory cell MC1 or MC2. Accordingly, the length of the second path D3+D4 from the third memory cell MC3 to the first contact plug CP1 is reduced, so that the overall length of the current path of the third memory cell MC3 becomes similar to that of the current path of the first or second memory cell MC1 or MC2.

Figure 5A:
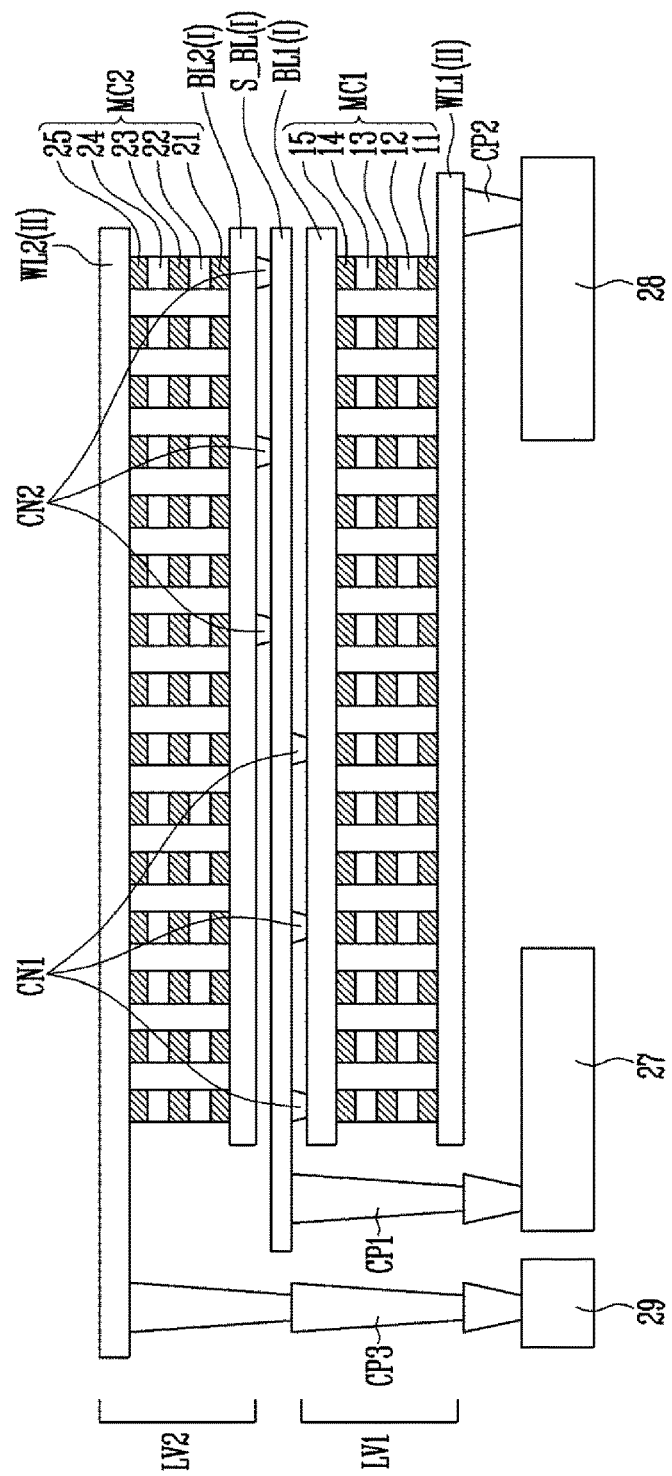
Figure 5C:
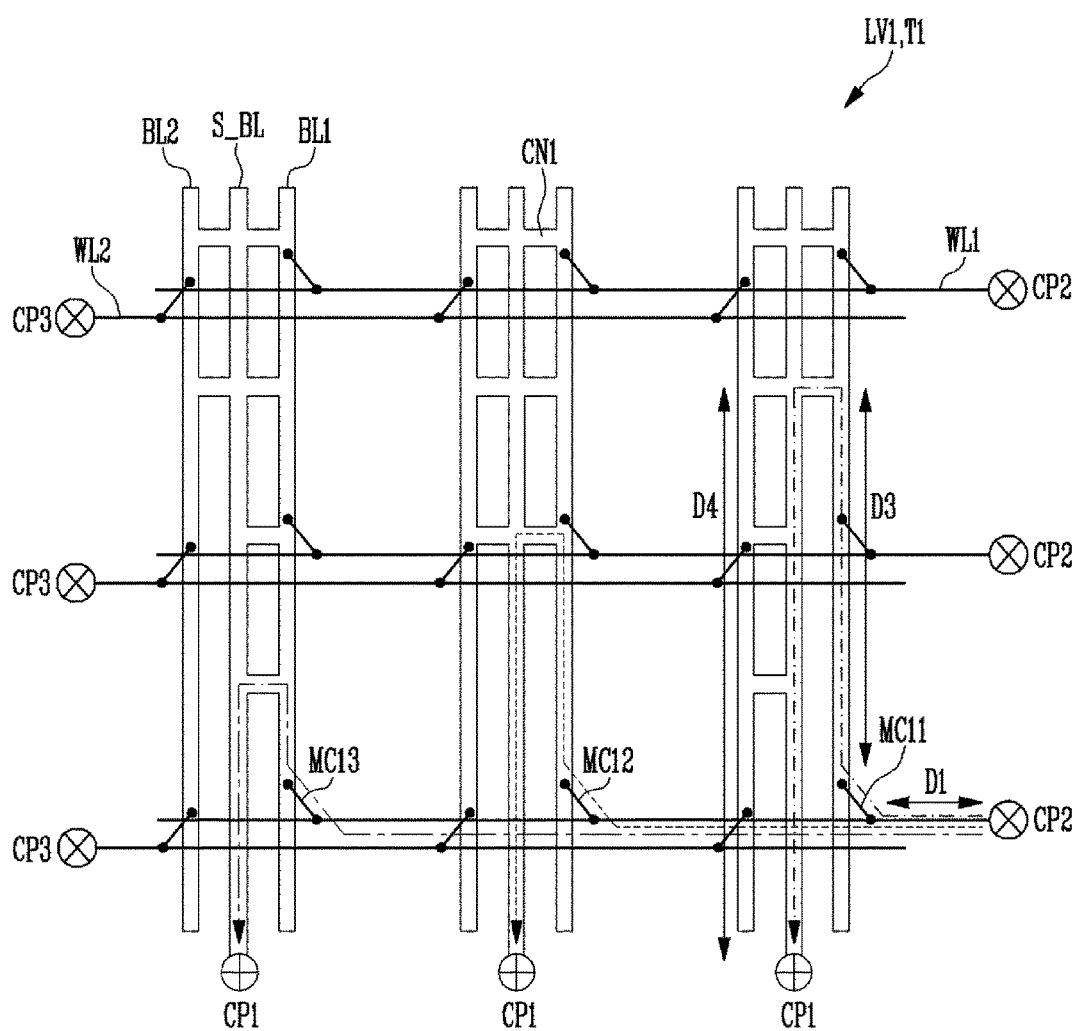
Figure 5D:
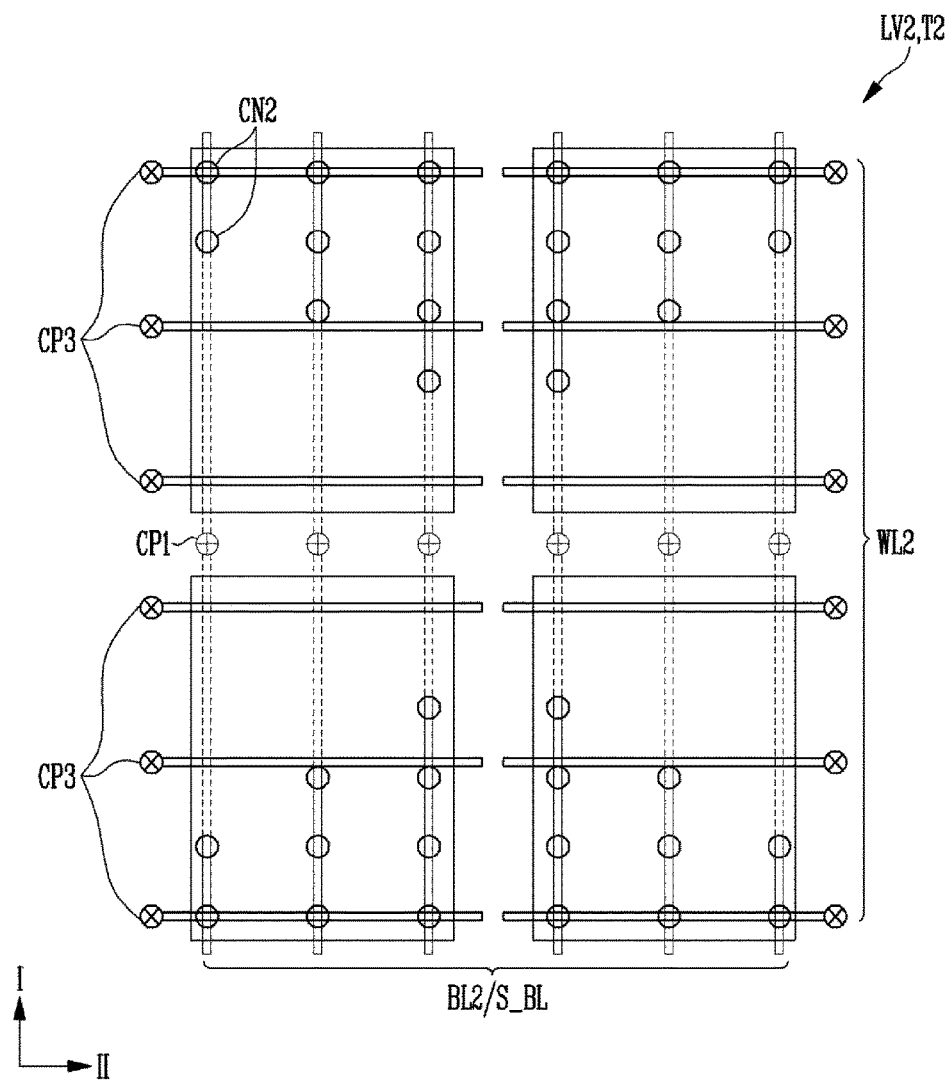
Figure 5E:
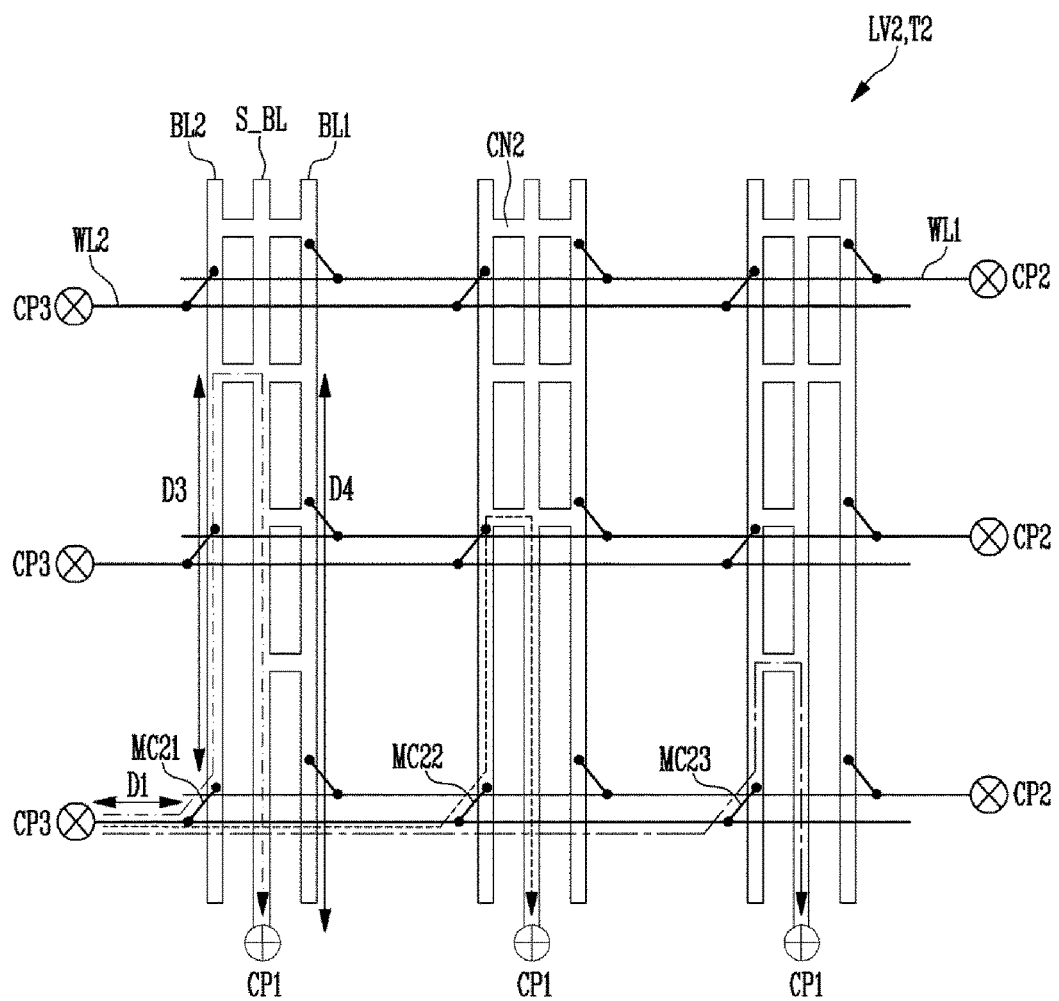

FIGS. 5A to 5E are diagrams illustrating the structure of an electronic device in accordance with an embodiment of the present disclosure, in which FIG. 5A is a sectional view of a cell array, FIGS. 5B and 5D are diagrams illustrating a layout of the cell array, and FIGS. 5C and 5E are conceptual views illustrating current paths. In the following description, description of certain elements that are discussed above is omitted for the sake of brevity.

Referring to FIG. 5A, the electronic device in accordance with an embodiment of the present disclosure may include a semiconductor memory. The semiconductor memory may include first column lines BL1, first row lines WL1, first memory cells MC1, sub-column lines S_BL, second column lines BL2, second row lines WL2, second memory cells MC2, first contact plugs CP1, second contact plugs CP2, third contact plugs CP3, first connection structures CN1, and second connection structures CN2. Here, the first and second column lines BL1 and BL2 may be bit lines, sub-column lines S_BL may be sub-bit lines, and first and second row lines WL1 and WL2 may be word lines.

The second column lines BL2 and the second row lines WL2 may be disposed on different levels. The second row lines WL2 may be disposed over the second column lines BL2. The second column lines BL2 may extend in the first direction I, and the second row lines WL2 may extend in the second direction II. In this drawing, for the sake of description, the first and second column lines BL1 and BL2 are illustrated in a sectional view corresponding to the first direction I, and the first and second row lines WL1 and WL2 are illustrated in a sectional view corresponding to the second direction II.

The second memory cells MC2 are disposed at respective intersections of the second column lines BL2 and the second row lines WL2. The second memory cells MC2 each may have a structure similar to that of each of the first memory cells MC1, or may have a symmetric structure with respect to the first memory cells MC1. For example, each of the second memory cells MC2 may include a lower electrode 21, a switching material layer 22, an intermediate electrode 23, a variable resistance material layer 24, and an upper electrode 25 which are successively stacked. Here, the positions of the switching material layer 22 and the variable resistance material layer 24 may be switched with each other. The lower electrode 21 may be electrically coupled to the second column line BL2. The upper electrode 25 may be electrically coupled to the second row line WL2.

The sub-column lines S_BL may be disposed between the first column lines BL1 and the second column lines BL2 and extend in the first direction I. For example, the first row lines WL1, the first column lines BL1, the sub-column lines S_BL, the second column lines BL2, and the second row lines WL2 may be successively stacked. Furthermore, the sub-column lines S_BL may be coupled to the first column lines BL1 by the first connection structures CN1 and coupled to the second column lines BL2 by the second connection structures CN2.

The first contact plugs CP1 may be electrically coupled to the sub-column lines S_BL. The sub-column lines S_BL may be coupled to a column circuit by the first contact plugs CP1. Here, reference numeral "27" may denote the column circuit, or a line structure coupled with the column circuit.

The second contact plugs CP2 may be electrically coupled to the first row lines WL1. The first row lines WL1 are coupled to a row circuit by the second contact plugs CP2. Here, reference numeral "28" may denote the row circuit, or a line structure coupled with the row circuit.

The third contact plugs CP3 may be electrically coupled to the second row lines WL2. The second row lines WL2 are coupled to a row circuit by the third contact plugs CP3. Here, reference numeral "29" may denote the row circuit, or a line structure coupled with the row circuit. The row circuit 29 coupled with the third contact plugs CP3 and the row circuit 28 coupled with the second contact plugs CP2 may be the same row circuit or different row circuits.

In the foregoing structure, the semiconductor memory may include the first memory cells MC1 disposed on a first level LV1, and the second memory cells MC2 disposed on a second level LV2 that is different from the first level LV1. For example, a second deck including the second memory cells MC2 may be disposed on a first deck including the first memory cells MC1. The first deck and the second deck may share the sub-column line S_BL. The first memory cells MC1 of the first deck may form first tiles, and the second memory cells MC2 of the second deck may form second tiles.

Referring to FIG. 5B, the first tiles T1 disposed on the first level LV1 are arranged in the first direction I and the second direction II intersecting with the first direction I. First contact plugs CP1 and second plugs CP2 may be disposed between the adjacent first tiles T1. For example, the first contact plugs CP1 may be disposed between the first tiles T1 that are adjacent to each other in the first direction I. The second contact plugs CP2 may be disposed between the first tiles T1 that are adjacent to each other in the second direction II.

FIG. 5C illustrates current paths determined depending on relative positions of the memory cells included in the first tile T1 disposed on the first level LV1. Here, each current path is formed by a combination of a first path D1 from a selected memory cell to the corresponding second contact plug CP2 and a second path from the selected memory cell to the corresponding first contact plug CP1. The second path is formed by a combination of a third path D3 on the first column line BL1 and a fourth path D4 on the sub-column line S_BL.

For instance, among memory cells MC11 to MC13 sharing the same first row line WL1, the first memory cell MC11 is disposed closer to the corresponding second contact plug CP2 than is the second or third memory cell MC12 or MC13. Therefore, the first connection structure CN1 for the corresponding first column line BL1 and the corresponding sub-column line S_BL may be disposed relatively far from the corresponding first contact plug CP1 so as to increase the length of the second path D3+D4 from the first memory cell MC11 to the first contact plug CP1.

Furthermore, among the memory cells MC11 to MC13 sharing the same first row line WL1, the third memory cell MC13 is disposed farther from the corresponding second contact plug CP2 than is the first or second memory cell MC11 or MC12. Therefore, the first connection structure CN1 for the corresponding first column line BL1 and the corresponding sub-column line S_BL may be disposed relatively near to the corresponding first contact plug CP1 so as to reduce the length of the second path D3+D4 from the third memory cell MC13 to the first contact plug CP1.

As a result, the first to third memory cells MC11 to MC13 may have current paths having a uniform length, and have similar resistance values.

Referring to FIG. 5D, the second tiles T2 disposed on the second level LV2 are arranged in the first direction I and the second direction II intersecting with the first direction I. First contact plugs CP1 and third plugs CP3 may be disposed between the adjacent second tiles T2. For example, the first contact plugs CP1 may be disposed between the second tiles T2 that are adjacent to each other in the first direction I. The third contact plugs CP3 may be disposed between the second tiles T2 that are adjacent to each other in the second direction II.

Referring to FIGS. 5A and 5D, the first column lines BL1 of the first level LV1 and the second column lines BL2 of the second level LV2 may share the first contact plugs CP1 and be coupled to the same column circuit. In other words, the first contact plugs CP1 may extend from the first level LV1 to the second level LV2 and be electrically coupled with the first column lines BL1 and the second column lines BL2. The second contact plugs CP2 and the third contact plugs CP3 may be arranged not to overlap each other in a stacking direction. Thus, the second contact plugs CP2 and the third contact plugs CP3 may be alternately arranged in the second direction II.

FIG. 5E illustrates current paths determined depending on relative positions of the memory cells included in the second tile T2 disposed on the second level LV2. Here, each current path is formed by a combination of a first path D1 from a selected memory cell to the corresponding third contact plug CP3 and a second path from the selected memory cell to the corresponding first contact plug CP1. The second path is formed by a combination of a third path D3 on the second column line BL2 and a fourth path D4 on the sub-column line S_BL.

For instance, among memory cells MC21 to MC23 sharing the same second row line WL2, the first memory cell MC21 is disposed closer to the corresponding third contact plug CP3 than is the second or third memory cell MC22 or MC23. Therefore, the second connection structure CN2 for the corresponding second column line BL2 and the corresponding sub-column line S_BL may be disposed relatively far from the corresponding first contact plug CP1 so as to increase the length of the second path D3+D4 from the first memory cell MC21 to the first contact plug CP1.

Furthermore, among the memory cells MC21 to MC23 sharing the same second row line WL2, the third memory cell MC23 is disposed farther from the corresponding third contact plug CP3 than is the first or second memory cell MC21 or MC22. Therefore, the second connection structure CN2 for the corresponding second column line BL2 and the corresponding sub-column line S_BL may be disposed closer to the corresponding first contact plug CP1 so as to reduce the length of the second path D3+D4 from the third memory cell MC23 to the first contact plug CP1.

As a result, the first to third memory cells MC21 to MC23 may have current paths having a uniform length, and have similar resistance values.

In the foregoing structure, the second tiles T2 may be disposed over the first tiles T1 in a multi-deck structure in which the memory cells are three-dimensionally stacked. Here, the first memory cells MC1 of the first tiles T1 and the second memory cells MC2 of the second tiles T2 may share the sub-column lines S_BL, and be coupled to the same column circuit by the sub-column lines S_BL and the first contact plugs CP1.

In addition, not only may the current paths and resistance values of the first memory cells MC1 disposed on the first level LV1 be compensated for, but the current paths and resistance values of the second memory cells MC2 disposed on the second level LV2 may also be compensated for.

Figure 6B:
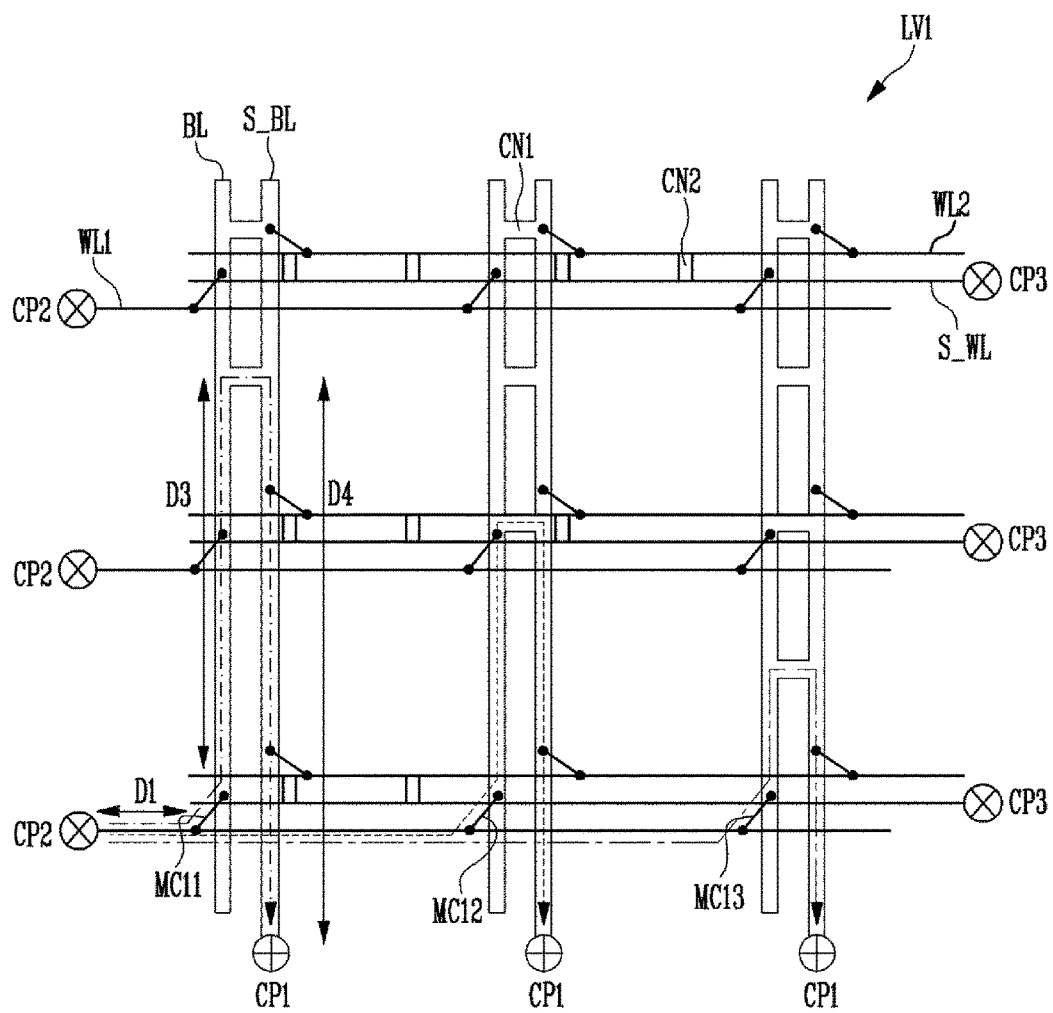
Figure 6C:
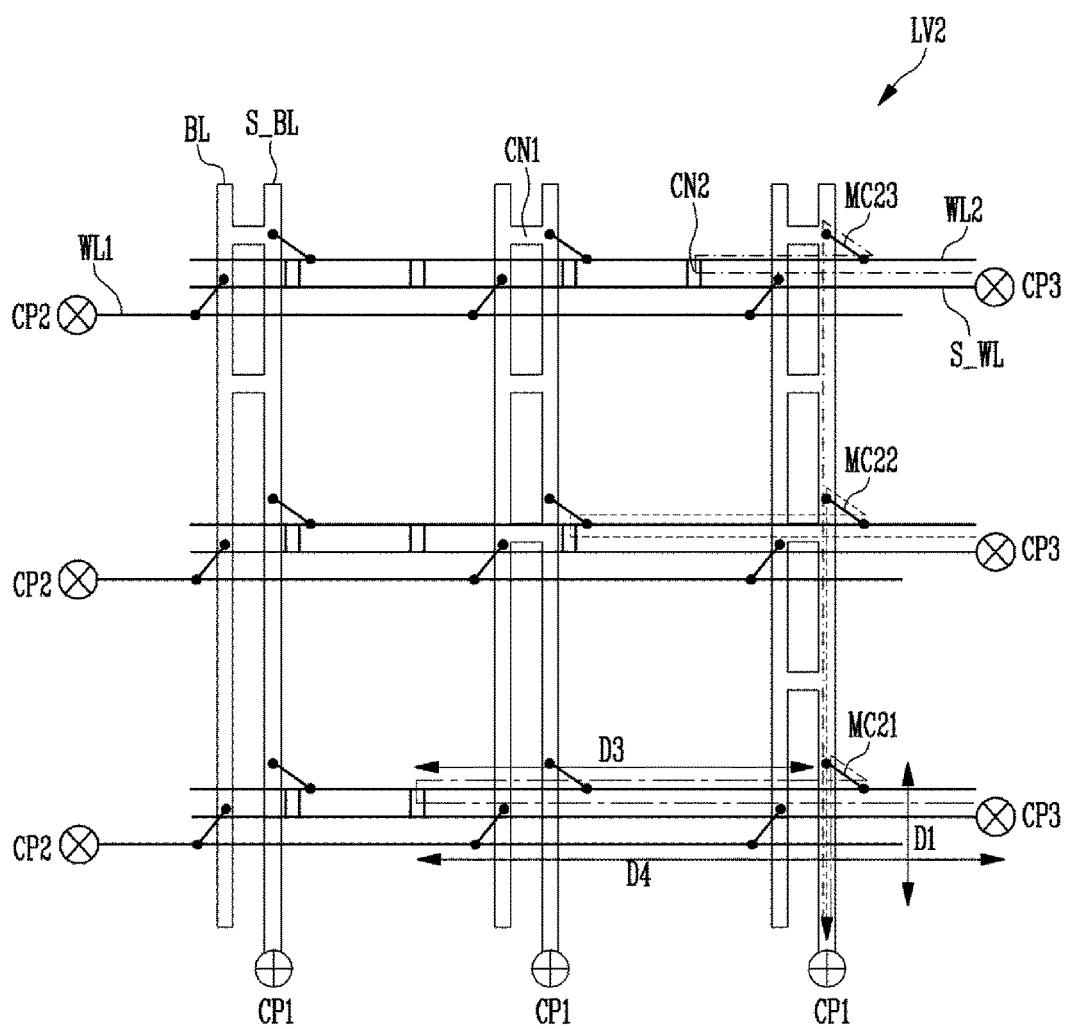

FIGS. 6A to 6C are diagrams illustrating the structure of an electronic device in accordance with an embodiment of the present disclosure, in which FIG. 6A is a sectional view of a cell array, and FIGS. 6B and 6C are conceptual views illustrating current paths. In the following description, description of certain elements that are discussed above is omitted for the sake of brevity.

Referring to FIG. 6A, an electronic device in accordance with an embodiment of the present disclosure may include a semiconductor memory. The semiconductor memory may include column lines BL, first row lines WL1, first memory cells MC1, sub-column lines S_BL, second row lines WL2, second memory cells MC2, sub-row lines S_WL, first contact plugs CP1, second contact plugs CP2, third contact plugs CP3, first connection structures CN1, and second connection structures CN2. Here, each column line BL may be a bit line, each sub-column line S_BL may be a sub-bit line, and each of the first and second row lines WL1 and WL2 may be a word line.

The first row lines WL1 may be disposed over the column lines BL. The first memory cells MC1 may be disposed at respective intersections of the column lines BL and the first row lines WL1.

The sub-column lines S_BL may be disposed under the column lines BL. For example, the sub-column lines S_BL, the column lines BL, and the first row lines WL1 may be successively stacked. The sub-column lines S_BL may be coupled to the column lines BL by the first connection structure CN1 at a predetermined location.

The second row lines WL2 may be disposed under the sub-column lines S_BL. The second memory cells MC2 may be disposed at respective intersections of the sub-column lines S_BL and the second row lines WL2.

The sub-row lines S_WL may be disposed under the second row lines WL2. For example, the sub-row lines S_WL, the second row lines WL2, and the sub-column lines S_BL may be successively stacked. The sub-row lines S_WL may be coupled to the second row lines WL2 by the second connection structure CN2.

In FIG. 6A, for the sake of description, the column lines BL and the sub-column lines S_BL are illustrated in a sectional view corresponding to the first direction I, and the first row lines WL1, the second row lines WL2, and the sub-row lines S_WL are illustrated in a sectional view corresponding to the second direction II.

The first contact plugs CP1 may be electrically coupled to the sub-column lines S_BL. The sub-column lines S_BL may be coupled to a column circuit by the first contact plugs CP1. Here, reference numeral "37" may denote the column circuit, or a line structure coupled with the column circuit.

The second contact plugs CP2 may be electrically coupled to the first row lines WL1. The first row lines WL1 are coupled to a row circuit by the second contact plugs CP2. Here, reference numeral "38" may denote the row circuit, or a line structure coupled with the row circuit.

The third contact plugs CP3 may be electrically coupled to the sub-row lines S_WL. The sub-row lines S_WL are coupled to a row circuit by the third contact plugs CP3. Here, reference numeral "39" may denote the row circuit, or a line structure coupled with the row circuit. The row circuit 39 coupled with the third contact plugs CP3 and the row circuit 38 coupled with the second contact plugs CP2 may be the same row circuit or different row circuits.

In the foregoing structure, the semiconductor memory may have a multi-level structure. In such an embodiment, the first tiles T1 including the first memory cells MC1 may be disposed over the second tiles T2 including the second memory cells MC2. In addition, the first memory cells MC1 of the first tiles T1 and the second memory cells MC2 of the second tiles T2 may share the same sub-column lines S_BL, and be coupled to the same column circuit by the sub-column lines S_BL and the first contact plugs CP1.

Referring to FIG. 6B, each current path is formed by a combination of a first path D1 from a selected memory cell to the corresponding second contact plug CP2 and a second path from the selected memory cell to the corresponding first contact plug CP1. The second path is formed by a combination of a third path D3 on the column line BL and a fourth path D4 on the sub-column line S_BL.

Among memory cells MC11 to MC13 sharing the same first row line WL1, the first memory cell MC11 is disposed closer to the corresponding second contact plug CP2 than is the second or third memory cell MC12 or MC13. Therefore, the first connection structure CN1 for the corresponding column line BL and the corresponding sub-column line S_BL may be disposed relatively far from the corresponding first contact plug CP1 so as to increase the length of the second path D3+D4 from the first memory cell MC11 to the first contact plug CP1.

Furthermore, among the memory cells MC11 to MC13 sharing the same first row line WL1, the third memory cell MC13 is disposed farther from the corresponding second contact plug CP2 than is the first or second memory cell MC11 or MC12. Therefore, the first connection structure CN1 for the corresponding column line BL and the corresponding sub-column line S_BL may be disposed relatively near to the corresponding first contact plug CP1 so as to reduce the length of the second path D3+D4 from the third memory cell MC13 to the first contact plug CP1.

As a result, the first to third memory cells MC11 to MC13 may have current paths having a uniform length, and have similar resistance values.

Referring to FIG. 6C, each current path is formed by a combination of a second path from a selected memory cell to the corresponding third contact plug CP3 and a first path from the selected memory cell to the corresponding first contact plug CP1. The second path is formed by a combination of a third path D3 on the second row line WL2 and a fourth path D4 on the sub-row line S_WL.

Among memory cells MC21 to MC23 sharing the same sub-column line S_BL, the first memory cell MC21 is disposed closer to the corresponding first contact plug CP1 than is the second or third memory cell MC22 or MC23. Therefore, the second connection structure CN2 for the corresponding second row line WL2 and the corresponding sub-row line S_WL may be disposed relatively far from the corresponding third contact plug CP3 so as to increase the length of the second path D3+D4 from the third contact plug CP3 to the first memory cell MC21.

Furthermore, among the memory cells MC21 to MC23 sharing the same sub-column line S_BL, the third memory cell MC23 is disposed farther from the corresponding first contact plug CP1 than is the first or second memory cell MC21 or MC22. Therefore, the second connection structure CN2 for the corresponding second row line WL2 and the corresponding sub-row line S_WL may be disposed relatively near to the corresponding third contact plug CP3 so as to reduce the length of the second path D3+D4 from the third contact plug CP3 to the third memory cell MC23.

As a result, the first to third memory cells MC21 to MC23 may have current paths having a uniform length, and have similar resistance values.

In the foregoing structure, not only may the current paths and resistance values of the first memory cells MC1 disposed on the first level LV1 be compensated for, but the current paths and resistance values of the second memory cells MC2 disposed on the second level LV2 may also be compensated for.

Figure 7A:
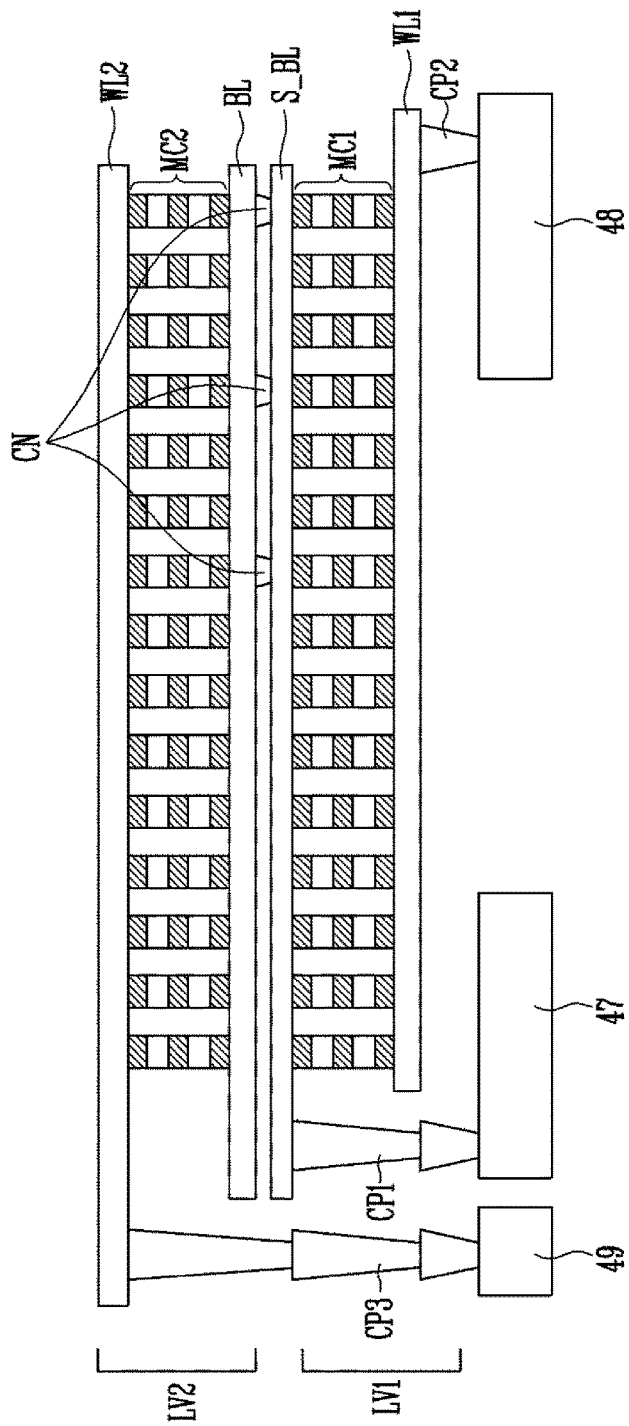
Figure 7B:
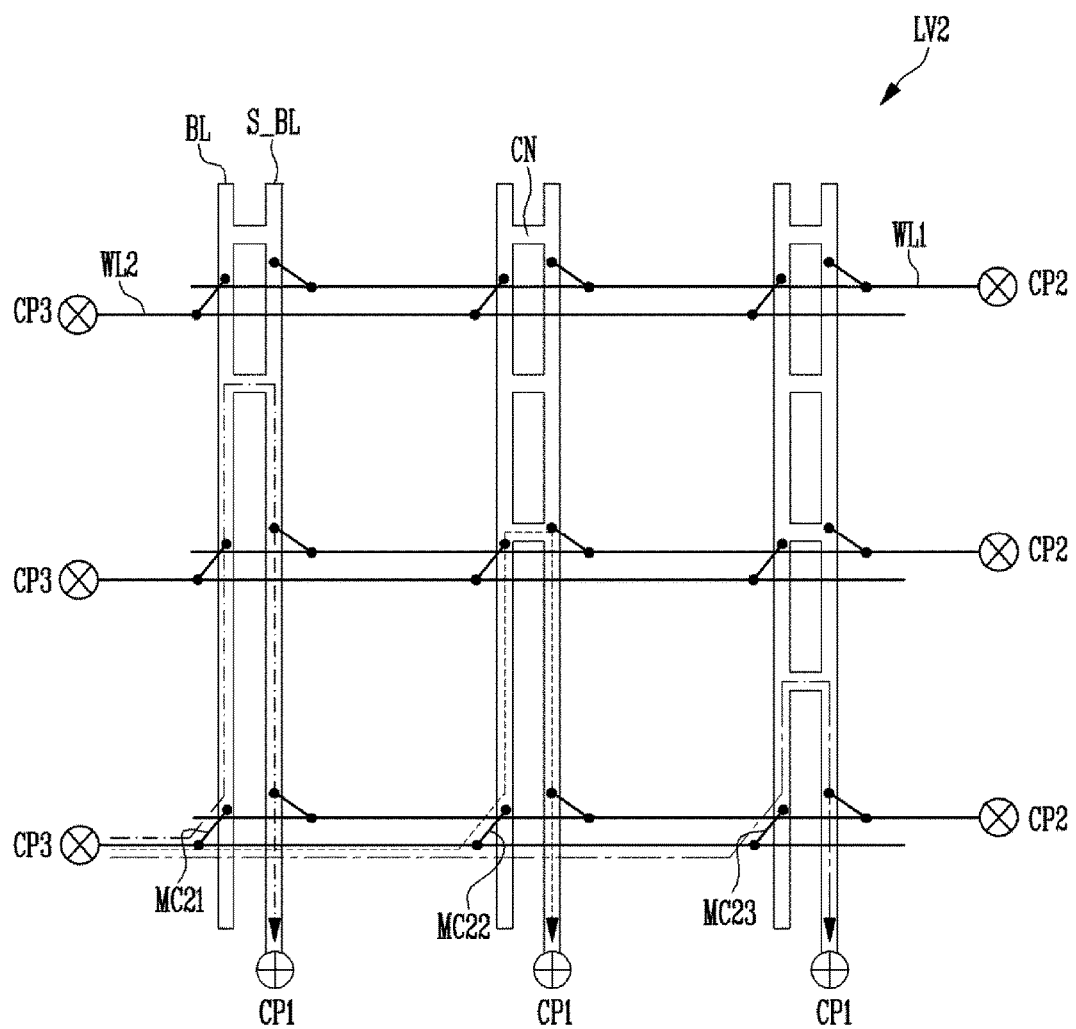

FIGS. 7A and 7B are diagrams illustrating the structure of an electronic device in accordance with an embodiment of the present disclosure, in which FIG. 7A is a sectional view of a cell array, and FIG. 7B is a conceptual view illustrating current paths. In the following description, description of certain elements that are discussed above is omitted for the sake of brevity.

Referring to FIG. 7A, the electronic device in accordance with an embodiment of the present disclosure may include a semiconductor memory. The semiconductor memory may include column lines BL, first row lines WL1, first memory cells MC1, sub-column lines S_BL, second row lines WL2, second memory cells MC2, first contact plugs CP1, second contact plugs CP2, third contact plugs CP3, and connection structures CN. The first row lines WL1, the sub-column lines S_BL, the column lines BL, and the second row lines WL2 may be successively stacked. Here, each column line BL may be a bit line, each sub-column line S_BL may be a sub-bit line, and each of the first and second row lines WL1 and WL2 may be a word line.

The first memory cells MC1 are disposed at respective intersections of the first row lines WL1 and the sub-column lines S_BL. The second memory cells MC2 are disposed at respective intersections only of the column lines BL and the second row lines WL2. The sub-column lines S_BL may be disposed under the column lines BL, and coupled to the column lines BL by the connection structures CN.

The first contact plugs CP1 may be electrically coupled to the sub-column lines S_BL. The sub-column lines S_BL may be coupled to a column circuit by the first contact plugs CP1. Here, reference numeral "47" may denote the column circuit, or a line structure coupled with the column circuit.

The second contact plugs CP2 may be electrically coupled to the first row lines WL1. The first row lines WL1 are coupled to a row circuit by the second contact plugs CP2. Here, reference numeral "48" may denote the row circuit, or a line structure coupled with the row circuit.

The third contact plugs CP3 may be electrically coupled to the second row lines WL2. The second row lines WL2 are coupled to a row circuit by the third contact plugs CP3. Here, reference numeral "49" may denote the row circuit, or a line structure coupled with the row circuit. The row circuit 49 coupled with the third contact plugs CP3 and the row circuit 48 coupled with the second contact plugs CP2 may be the same row circuit or different row circuits.

In accordance with the foregoing structure, an embodiment includes a two level structure in which a second level including the second memory cells MC2 is disposed over a first level including the first memory cells MC1. Furthermore, current paths of the memory cells may be compensated for with respect to only any one of the first level and the second level. For example, the material types, shapes, and structures of the first memory cells MC1 may be different from those of the second memory cells MC2, or the bias directions may differ from each other. In such an embodiment, the current paths of only the second memory cells MC2 may be compensated for by connection structures without compensating for the current paths of the first memory cells MC1. On the other hand, the current paths of only the first memory cells MC1 may be compensated for by connection structures without compensating for the current paths of the second memory cells MC2. In other words, in some embodiments, connection structures are only applied to one level of a two-level structure.

FIG. 7A and FIG. 7B illustrate an embodiment in which the current paths of only the second memory cells MC2 on the second level of a two level structure are compensated for. Referring to FIG. 7B, a first memory cell M21 is disposed relatively near to the corresponding third contact plug CP3. Therefore, the connection structure CN for the corresponding column line BL and the corresponding sub-column line S_BL may be disposed relatively far from the corresponding first contact plug CP1 so as to increase the length of the path from the first memory cell MC21 to the first contact plug CP1. In addition, a third memory cell MC23 is disposed relatively far from the corresponding contact plug CP3. Therefore, the connection structure CN for the corresponding column line BL and the corresponding sub-column line S_BL may be disposed relatively near to the corresponding first contact plug CP1 so as to reduce the length of the path from the third memory cell MC23 to the first contact plug CP1.

In the foregoing structure, the current paths of only the second memory cells MC2 disposed on the second level LV2 may be compensated for without compensating for the current paths of the first memory cells MC1 disposed on the first level LV1. For reference, in an embodiment in which the first contact plugs CP1 are directly coupled to the column lines BL rather than the sub-column lines S_BL, the current paths of only the first memory cells MC1 may be compensated for without compensating for the current paths of the second memory cells MC2.

Figure 9A:
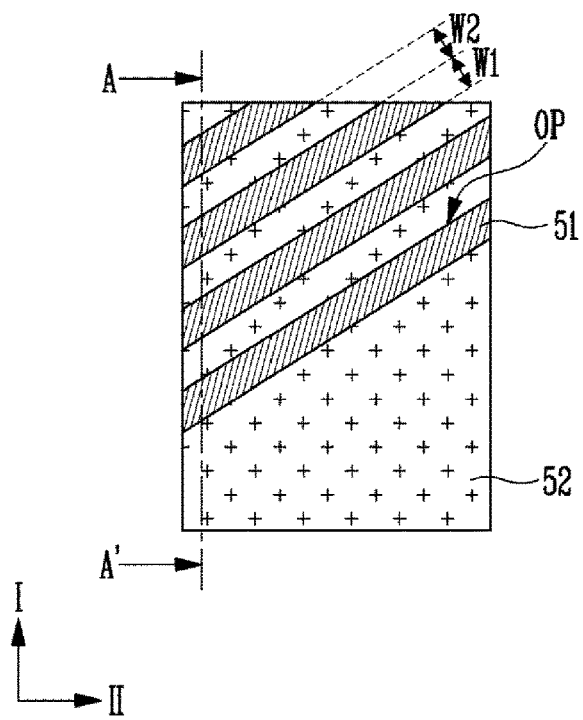
FIGS. 9A, 10A and 11A are layout diagrams and 9B, 10B and 11B are sectional views illustrating a method of fabricating an electronic device in accordance with an embodiment of the present disclosure.
Figure 10A:
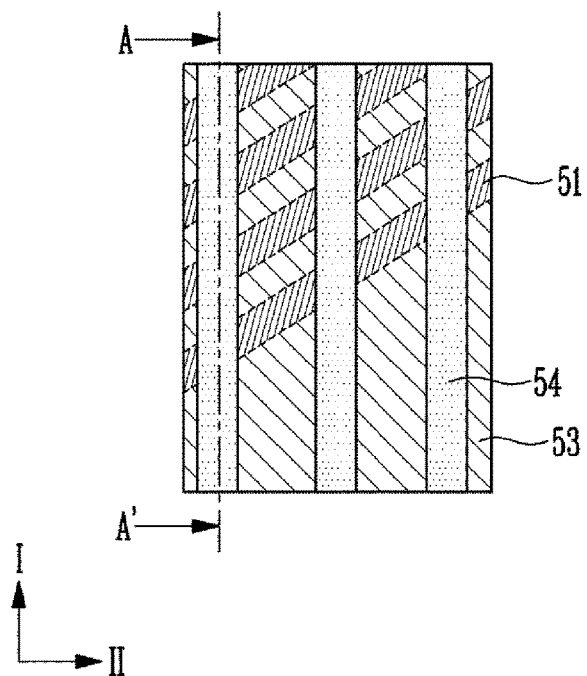
Figure 11A:
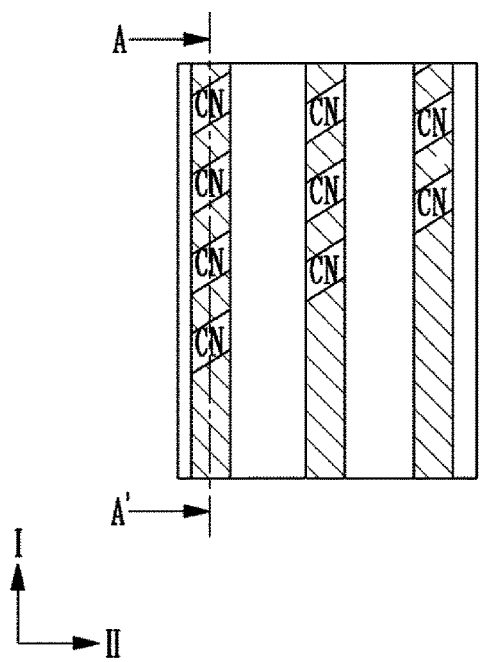

FIGS. 9A, 10A and 11A are layout diagrams and 9B, 10B and 11B are sectional views illustrating a method of fabricating an electronic device in accordance with an embodiment of the present disclosure. Hereinafter, a method of forming a connection structure will be described.

Figure 9B:
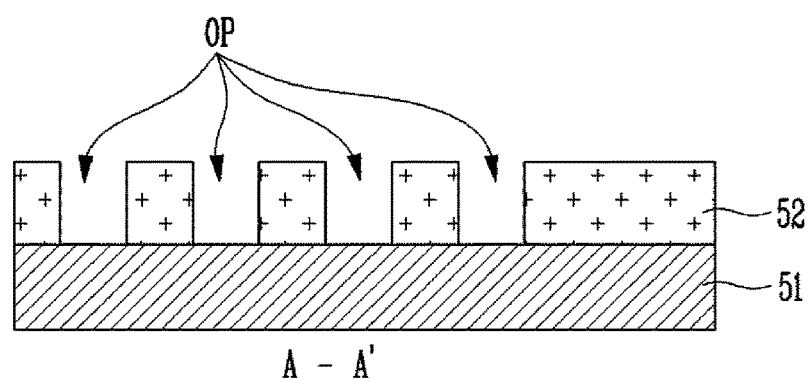

Referring to FIGS. 9A and 9B, a first conductive layer 51 is formed, and an insulating layer 52 is thereafter formed on the first conductive layer 51. The first conductive layer 51 may include conductive material such as tungsten, and may be a column line, a sub-column line, a row line or a sub-row line. The insulating layer 52 may insulate stacked conductive layers from each other, and include a dielectric material such as a nitride material.

Figure 12A:
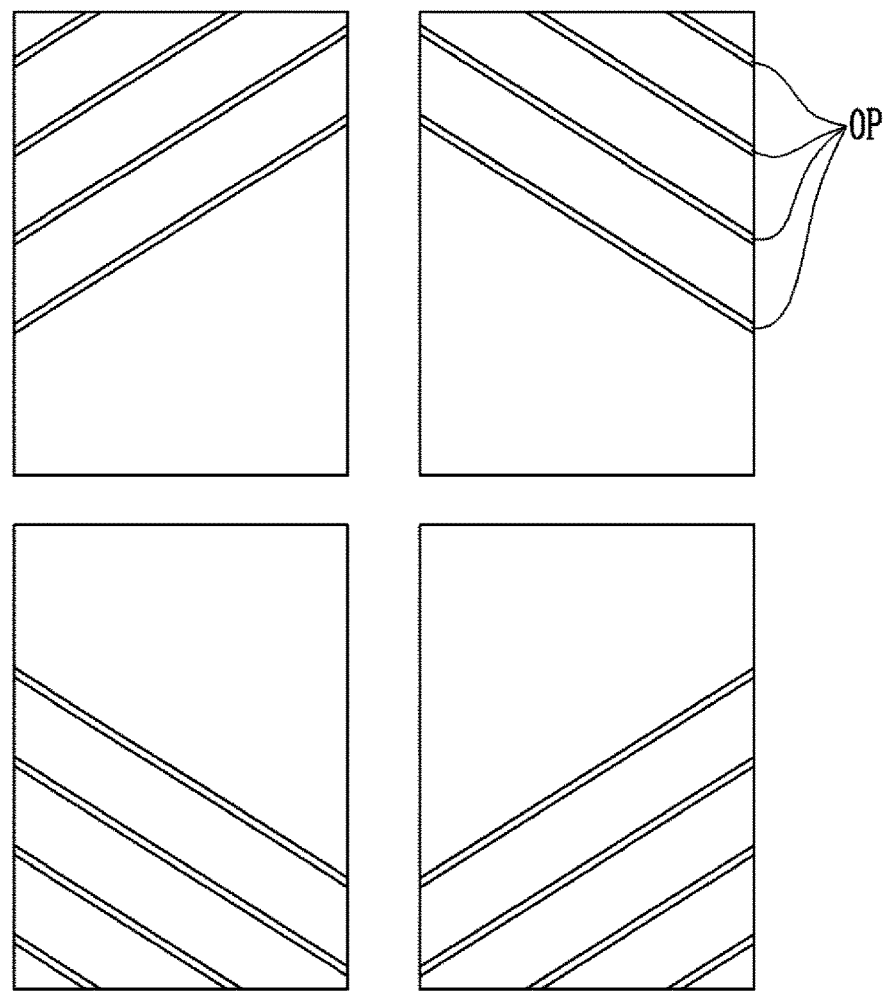
FIGS. 12A to 12C are diagrams illustrating modifications of openings (OP) in accordance with embodiments of the present disclosure.
Figure 12B:
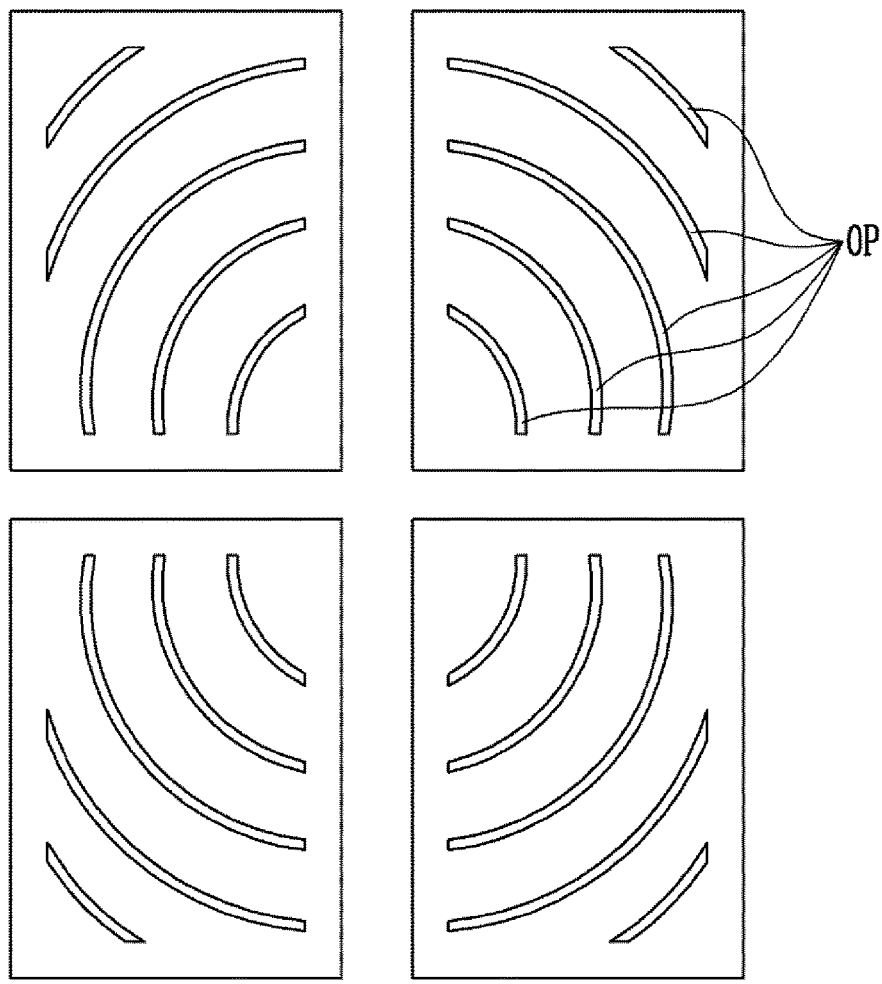
Figure 12C:
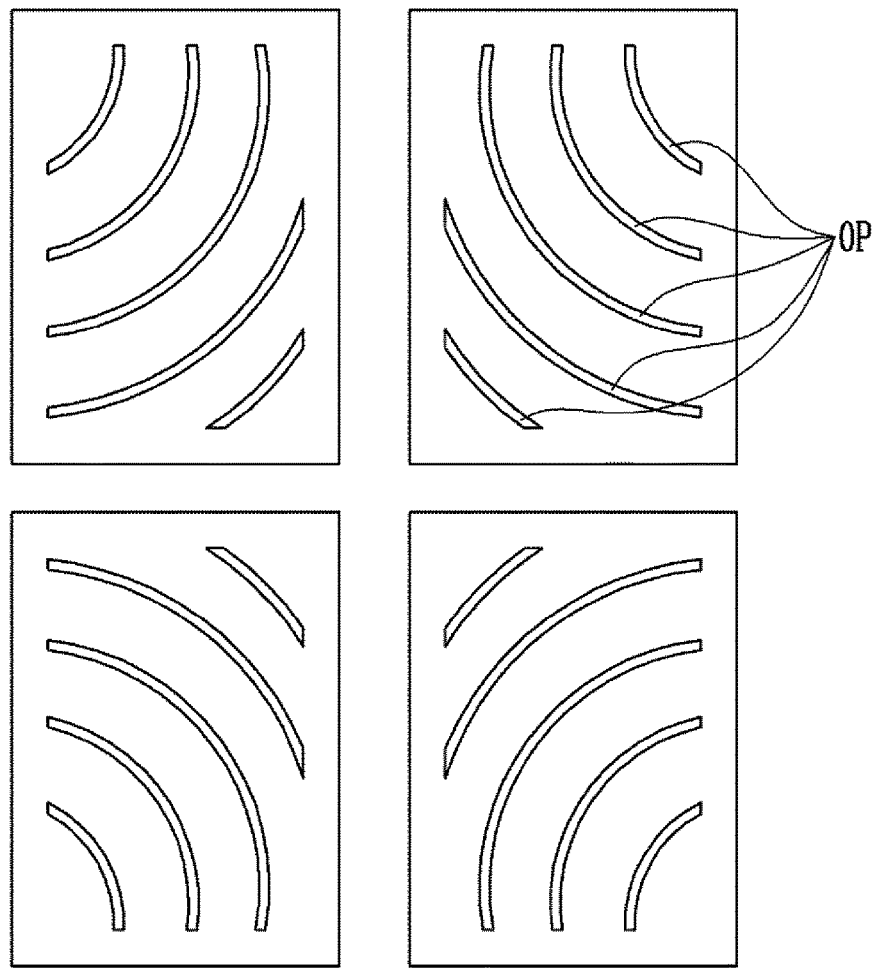

Subsequently, openings OP through which the first conductive layer 51 is exposed are formed passing through the insulating layer 52. The openings OP define regions in which connection structures are to be formed. The openings OP are formed within only the second region R2, and there is no opening OP in the first region R1. The shapes of the openings OP may be modified in various ways. Some modifications of the shapes of the openings OP are illustrated in FIGS. 12A to 12C. Referring to FIG. 12A, each of the openings OP may have a linear shape, extending in a diagonal direction intersecting with both the first direction I and the second direction II. Referring to FIG. 12B, each of the openings OP may have a curved shape, which is convex based on the center of the four tiles. Referring to FIG. 12C, each of the openings OP may have a curved shape, which is concave based on the center of the four tiles. Persons of skill in the art will recognize that other embodiments are possible. In addition, an opening OP may be formed by removing a part of the region of the insulating layer 52 that corresponds to the second region R2. The openings OP may have the form of lines spaced apart from each other by a predetermined distance.

A width W1 of each opening OP and a distance W2 between the openings OP may be vary in different embodiments. In FIG. 9A, for the sake of explanation, the width W1 of each opening OP has been expressed to be exaggerated. However, as shown in FIGS. 12A to 12C, the width W1 of each opening OP may have a value less than the distance W2 between the openings OP. For example, the widths W1 of the openings OP may be adjusted such that, when the openings OP are filled with conductive material during a subsequent process, an upper surface of a conductive layer formed by the conductive material can be planar.

Figure 10B:
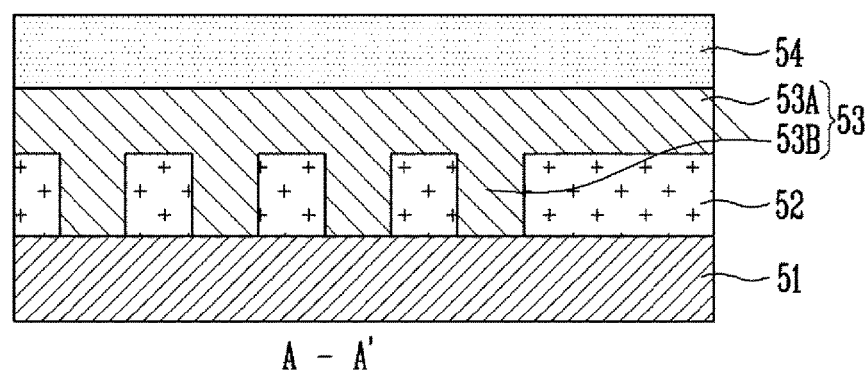

Referring to FIGS. 10A and 10B, a second conductive layer 53 is formed on the insulating layer 52. The second conductive layer 53 may include conductive material such as tungsten. In addition, the second conductive layer 53 may include a first region 53A disposed over the insulating layer 52, and a second region 53B formed in each opening OP. The first region 53A may form a column line, a sub-column line, a row line or a sub-row line. The second region 53B may form a connection structure.

Thereafter, a mask pattern 54 is formed on the second conductive layer 53. The mask pattern 54 may have a linear shape extending in the first direction I, and define a column line and a sub-column line or define a row linen and a sub-row line.

Figure 11B:
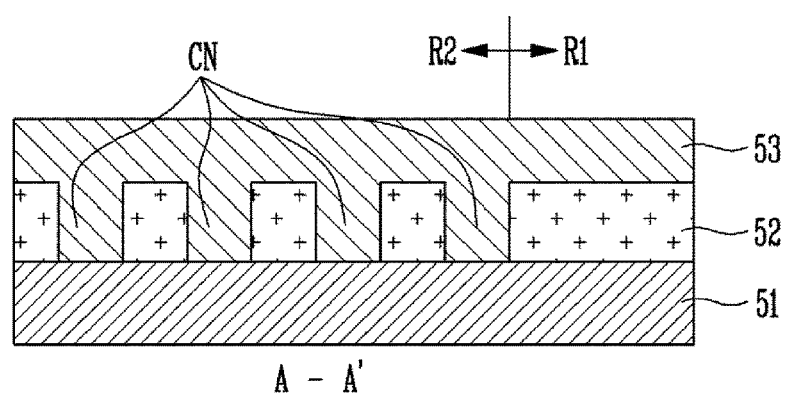

Referring to FIGS. 11A and 11B, the second conductive layer 53, the insulating layer 52, and the first conductive layer 51 are etched using the mask pattern 54 as an etching barrier. Thus, the second conductive layer 53A and the first conductive layer 51 are patterned in a linear shape, thereby forming a column line and a sub-column, or a row line and a sub-row line. The second conductive layer 53B remains only in regions in which the openings OP and the mask pattern 54 intersect with each other, thus forming connection structures CN each having an island shape.

In accordance with the fabricating method described above, the connection structures may be easily formed in the same process of forming row or column lines.

Figure 13:
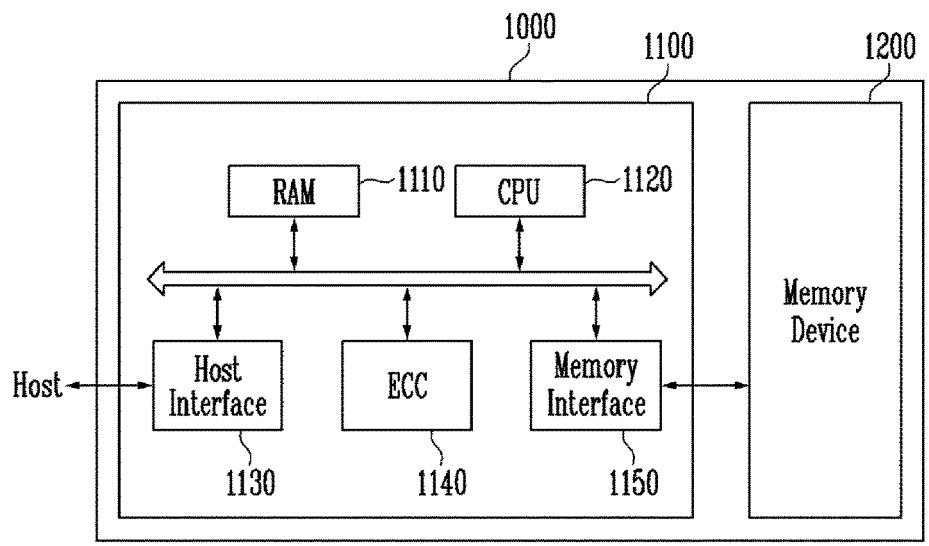
FIGS. 13 and 14 are block diagrams illustrating the configuration of a memory system in accordance with an embodiment of the present disclosure.

FIG. 13 is a block diagram illustrating the configuration of a memory system 1000 according to an embodiment of the present disclosure.

Referring FIG. 13, the memory system 1000 according to the embodiment of the present invention includes a memory device 1200 and a controller 1100.

The memory device 1200 may be used to store data information having a variety of data forms such as text, graphics, software codes, and so on. The memory device 1200 may be a nonvolatile memory. The memory device 1200 may have the structure described with reference to FIGS. 1A to 12C, and be fabricated by the fabricating method described with reference to FIGS. 1A to 12C. In an embodiment, the memory device 1200 may include first column lines extending in a first direction; sub-column lines extending in the first direction; first row lines extending a second direction intersecting with the first direction; first tiles which include first memory cells connected between the first column lines and the first row lines; first contact plugs which are coupled to the sub-column lines and disposed between the first tiles that are adjacent to each other in the first direction; second contact plugs which are coupled to the first row lines and disposed between the first tiles that are adjacent to each other in the second direction; and first connection structures which couple the first column lines to the sub-column lines such that the longer a current path on a first row line from a selected first memory cell to a corresponding second contact plug, the shorter a current path from the selected first memory cell to a corresponding first contact plug. The structure of the memory device 1200 and the fabricating method thereof are the same as those described above; therefore detailed explanation thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a random access memory (RAM; 1110), a central processing unit (CPU; 1120), a host interface 1130, an error correction code (ECC) circuit 1140, a memory interface 1150, and so on.

The RAM 1110 may be used as an operation memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. The controller 1100 may further include a ROM which stores code data to interface with the host.

Since the memory system 1000 according to the embodiment includes the memory device 1200 having improved integration and characteristics, the integration and characteristics of the memory system 1000 may also be improved.

Figure 14:
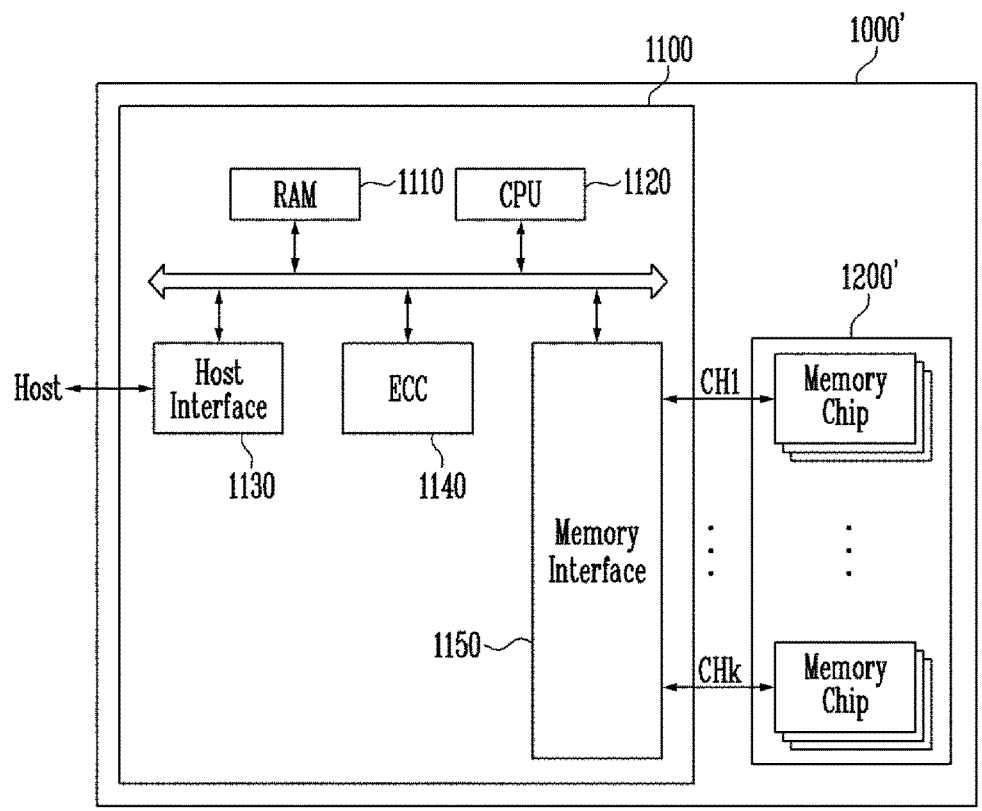

FIG. 14 is a block diagram showing the configuration of a memory system 1000' according to an embodiment of the present disclosure. In the following description, description of certain elements that are discussed above is omitted for the sake of brevity.

Referring to FIG. 14, the memory system 1000' according to the embodiment may include a memory device 1200' and a controller 1100. The controller 1100 includes a RAM 1110, a CPU 120, a host interface 1130, an ECC circuit 1140, a memory interface 1150, and so on.

The memory device 1200' may be a nonvolatile memory. The memory device 1200' may have the structure described with reference to FIGS. 1A to 12C, and be fabricated by the fabricating method described with reference to FIGS. 1A to 12C. In an embodiment, the memory device 1200' may include first column lines extending in a first direction; sub-column lines extending in the first direction; first row lines extending a second direction intersecting with the first direction; first tiles which include first memory cells connected between the first column lines and the first row lines; first contact plugs which are coupled to the sub-column lines and disposed between the first tiles that are adjacent to each other in the first direction; second contact plugs which are coupled to the first row lines and disposed between the first tiles that are adjacent to each other in the second direction; and first connection structures which couple the first column lines to the sub-column lines such that the longer a current path on a first row line from a selected first memory cell to a corresponding second contact plug, the shorter a current path from the selected first memory cell to a corresponding first contact plug. The structure of the memory device 1200' and the fabricating method thereof are the same as those described above; therefore detailed explanation thereof will be omitted.

Furthermore, the memory device 1200' may be a multi-chip package including a plurality of memory chips. The plurality of memory chips may be divided into a plurality of groups. The plurality of groups may communicate with the controller 1100 through first to k-th channels CH1 to CHk. The memory chips of each group may communicate with the controller 1100 through a common channel. For reference, the memory system 1000' may be modified such that each memory chip is coupled to a corresponding single channel.

As described above, since the memory system 1000' according to the embodiment includes the memory device 1200' having improved integration and characteristics, the integration and characteristics of the memory system 1000' may also be improved. In particular, the memory device 1200' according to the present embodiment may be formed of a multi-chip package, whereby the data storage capacity and the operating speed thereof may be enhanced.

Figure 15:
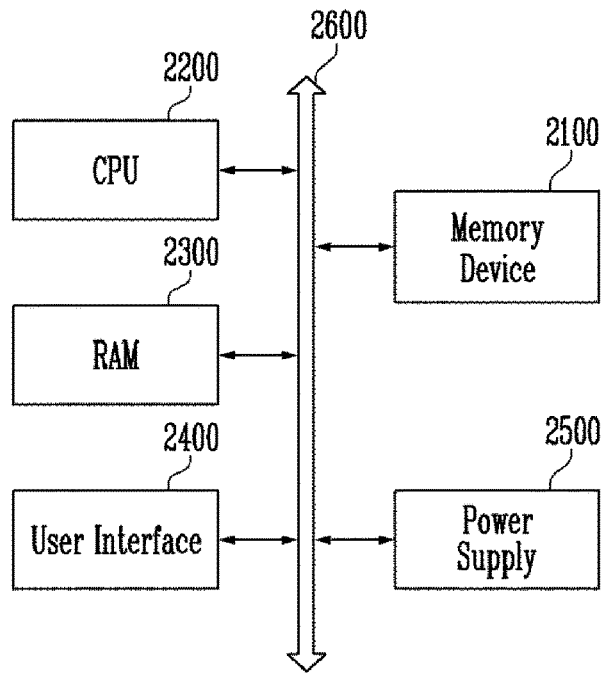
FIGS. 15 and 16 are block diagrams illustrating the configuration of a computing system in accordance with an embodiment of the present disclosure.

FIG. 15 is a block diagram showing the configuration of a computing system 2000 according to an embodiment of the present disclosure. In the following description, description of certain elements that are discussed above is omitted for the sake of brevity.

Referring to FIG. 15, the computing system 2000 according to an embodiment of the present disclosure may include a memory device 2100, a CPU 2200, a RAM 2300, a user interface 2400, a power supply 2500, a system bus 2600, and so forth.

The memory device 2100 may store data provided via the user interface 2400, data processed by the CPU 2200, etc. Furthermore, the memory device 2100 may be electrically coupled to the CPU 2200, the RAM 2300, the user interface 2400, the power supply 2500, etc. by the system bus 2600. For example, the memory device 2100 may be coupled to the system bus 2600 via a controller (not shown) or, alternatively, directly coupled to the system bus 2600. In the case where the memory device 2100 is directly coupled to the system bus 2600, the function of the controller may be performed by the CPU 2200, the RAM 2300, etc.

The memory device 2100 may be a nonvolatile memory. The memory device 2100 may have the structure described with reference to FIGS. 1A to 12C, and be fabricated by the fabricating method described with reference to FIGS. 1A to 12C. In an embodiment, the memory device 2100 may include first column lines extending in a first direction; sub-column lines extending in the first direction; first row lines extending a second direction intersecting with the first direction; first tiles which include first memory cells connected between the first column lines and the first row lines; first contact plugs which are coupled to the sub-column lines and disposed between the first tiles that are adjacent to each other in the first direction; second contact plugs which are coupled to the first row lines and disposed between the first tiles that are adjacent to each other in the second direction; and first connection structures which couple the first column lines to the sub-column lines such that the longer a current path on a first row line from a selected first memory cell to a corresponding second contact plug, the shorter a current path from the selected first memory cell to a corresponding first contact plug. The structure of the memory device 2100 and the fabricating method thereof are the same as those described above; therefore detailed explanation thereof will be omitted.

Furthermore, the memory device 2100 may be a multi-chip package including a plurality of memory chips, as described with reference to FIG. 14.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment includes the memory device 2100 having improved integration and characteristics, the characteristics of the computing system 2000 may also be improved.

Figure 16:
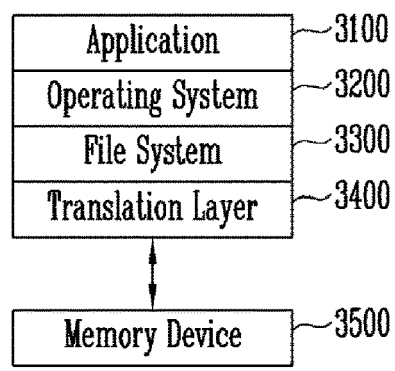

FIG. 16 is a block diagram illustrating a computing system 3000 according to an embodiment of the present disclosure.

Referring to FIG. 16, the computing system 3000 according to an embodiment of the present disclosure may include a software layer which includes an operating system 3200, an application 3100, a file system 3300, a translation layer 3400, and so forth. Furthermore, the computing system 3000 may include a hardware layer such as a memory device 3500.

The operating system 3200 may manage software resources and hardware resources, etc. of the computing system 3000 and control program execution by the CPU. The application 3100 may include various application programs to be performed in the computing system 3000, and be a utility to be implemented by the operating system 3200.

The file system 3300 may refer to a logical structure for controlling data, files, etc. which are present in the computing system 3000, and may organize files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed by separate blocks in the drawing, the application 3100 and the file system 3300 may be included in the operating system 3200.

The translation layer 3400 may translate an address into a suitable form for the memory device 3500 in response to a request from the file system 3300. For example, the translation layer 3400 may translate a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. The memory device 3500 may have the structure described with reference to FIGS. 1A to 12C, and be fabricated by the fabricating method described with reference to FIGS. 1A to 12C. In an embodiment, the memory device 3500 may include first column lines extending in a first direction; sub-column lines extending in the first direction; first row lines extending a second direction intersecting with the first direction; first tiles which include first memory cells connected between the first column lines and the first row lines; first contact plugs which are coupled to the sub-column lines and disposed between the first tiles that are adjacent to each other in the first direction; second contact plugs which are coupled to the first row lines and disposed between the first tiles that are adjacent to each other in the second direction; and first connection structures which couple the first column lines to the sub-column lines such that the longer a current path on a first row line from a selected first memory cell to a corresponding second contact plug, the shorter a current path from the selected first memory cell to a corresponding first contact plug. The structure of the memory device 3500 and the fabricating method thereof are the same as those described above; therefore detailed explanation thereof will be omitted.

The computing system 3000 having the above-mentioned configuration may be divided into an operating system layer to be implemented in an upper level region, and a controller layer to be implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment includes the memory device 3500 having improved integration and characteristics, the characteristics of the computing system 3000 may also be improved.

In an electronic device and a method of fabricating the electronic device in accordance with embodiments of the present disclosure, operating characteristics and reliability of memory cells may be improved. Particularly, variable resistance material may be prevented from deteriorating in characteristics.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device comprising a semiconductor memory,
    wherein the semiconductor memory comprises:
    first column lines extending in a first direction;
    sub-column lines extending in the first direction;
    first row lines extending in a second direction intersecting with the first direction;
    first tiles including first memory cells connected between the first column lines and the first row lines;
    first contact plugs disposed between the first tiles that are adjacent to each other in the first direction, the first contact plugs being coupled to the sub-column lines;
    second contact plugs disposed between the first tiles that are adjacent to each other in the second direction, the second contact plugs being coupled to the first row lines; and
    a first connection structure coupled between the first column lines and the sub-column lines at predetermined locations such that, as a length of a current path on a first row line from a selected first memory cell to a corresponding second contact plug increases, a length of a current path from the selected first memory cell to a corresponding first contact plug decreases.

2. The electronic device according to claim 1, further comprising:
   a column circuit coupled to the first column lines through the first contact plugs and the sub-column lines; and
   a row circuit coupled to the first row lines through the second contact plugs.

3. The electronic device according to claim 1, wherein the first row lines, the first column lines, and the sub-column lines are successively stacked.

4. The electronic device according to claim 1, wherein each of the first column lines is a bit line, each of the sub-column lines is a sub-bit line, and each of the first row lines is a word line.

5. The electronic device according to claim 1, further comprising:
   second column lines extending in the first direction;
   second row lines extending in the second direction;
   second tiles including second memory cells connected between the second column lines and the second row lines, the second tiles being disposed over the first tiles;
   third contact plugs disposed between the second tiles that are adjacent to each other in the second direction, the third contact plugs being coupled to the second row lines; and
   a second connection structure that couples the second column lines to the sub-column lines at predetermined locations such that, as a length of a current path on a second row line from a selected second memory cell to a corresponding third contact plug increases, a length of a current path from the selected second memory cell to a corresponding first contact plug decreases.

6. The electronic device according to claim 5, further comprising:
   a column circuit coupled to the second column lines through the first contact plugs and the sub-column lines; and
   a row circuit coupled to the second row lines through the third contact plugs.

7. The electronic device according to claim 5, wherein the first row lines, the first column lines, the sub-column lines, the second column lines, and the second row lines are successively stacked.

8. The electronic device according to claim 5, wherein each of the first column lines is a bit line, each of the sub-column lines is a sub-bit line, each of the first row lines is a word line, each of the second column lines is a bit line, and each of the second row lines is a word line.

9. The electronic device according to claim 5, wherein the second contact plugs and the third contact plugs are alternately arranged in the second direction without overlapping with each other in a stacking direction.

10. The electronic device according to claim 1, further comprising:
    second row lines extending in the second direction;
    sub-row lines extending in the second direction;
    second tiles including second memory cells connected between the sub-column lines and the second row lines, the second tiles being disposed under the first tiles;
    third contact plugs disposed between the second tiles that are adjacent to each other in the second direction, the third contact plugs being coupled to the sub-row lines; and
    a second connection structure coupled between the sub-row lines and the second row lines such that, as a length of a current path on a sub-column line from a selected second memory cell to a corresponding first contact plug increases, a length of a current path from the selected second memory cell to a corresponding third contact plug decreases.

11. The electronic device according to claim 10, further comprising:
    a column circuit coupled with the sub-column lines through the first contact plugs; and
    a row circuit coupled with the second row lines through the third contact plugs and the sub-row lines.

12. The electronic device according to claim 10, wherein the sub-row lines, the second row lines, the sub-column lines, the first column lines, and the first row lines are successively stacked.

13. The electronic device according to claim 10, wherein each of the first column lines is a bit line, each of the sub-column lines is a sub-bit line, each of the first row lines is a word line, each of the sub-row lines is a sub-word line, and each of the second row lines is a word line.

14. The electronic device according to claim 10, wherein the second contact plugs and the third contact plugs are alternately arranged in the second direction without overlapping with each other in a stacking direction.

15. The electronic device according to claim 1, further comprising:
    second row lines extending in the second direction;
    second tiles including second memory cells connected between the sub-column lines and the second row lines, the second tiles being disposed over the first tiles; and
    third contact plugs disposed between the second tiles that are adjacent to each other in the second direction, the third contact plugs being coupled to the second row lines.

16. An electronic device comprising a semiconductor memory, wherein the semiconductor memory comprises:
    a first deck including first memory cells;
    a second deck disposed over the first deck, and including second memory cells;
    a first column line electrically coupled to the first memory cells;
    a second column line electrically coupled to the second memory cells;
    a sub-column line disposed between the first deck and the second deck and coupled to a column circuit that drives the first column line and the second column line;
    a first connection structure coupled between the first column line and the sub-column line; and
    a second connection structure coupled between the second column line and the sub-column line.

17. The electronic device according to claim 16, further comprising a first row line electrically coupled to the first memory cells and driven by a row circuit.

18. The electronic device according to claim 17, wherein the first connection structure is configured such that, as a path on the first row line from the row circuit to a selected first memory cell increases, a distance from the column circuit to a position at which the first column line is coupled to the sub-column line decreases, and, as the path on the first row line from the row circuit to the selected first memory cell decreases, the distance from the column circuit to the position at which the first column line is coupled to the sub-column line increases.

19. The electronic device according to claim 16, further comprising a second row line electrically coupled to the second memory cells and configured to be driven by a row circuit.

20. The electronic device according to claim 19, wherein the second connection structure is configured such that, as a path on the second row line from the row circuit to a selected second memory cell increases, a distance from the column circuit to a position at which the second column line is coupled to the sub-column line decreases, and, as the path on the second row line from the row circuit to the selected second memory cell decreases, the distance from the column circuit to the position at which the second column line is coupled to the sub-column line increases.

* * * * *